(12) United States Patent
Kim et al.

(10) Patent No.: US 9,509,537 B2
(45) Date of Patent: Nov. 29, 2016

(54) IN-BAND DATA COMMUNICATION SYSTEM USING WIRELESS POWER

(75) Inventors: Nam Yun Kim, Seoul (KR); Sang Wook Kwon, Seongnam-si (KR); Yun Kwon Park, Dongducheon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 487 days.

(21) Appl. No.: 13/463,893

(22) Filed: May 4, 2012

(65) Prior Publication Data

US 2012/0300872 A1    Nov. 29, 2012

(30) Foreign Application Priority Data

May 27, 2011    (KR) .................. 10-2011-0050504

(51) Int. Cl.
| | | |
|---|---|---|
| H04K 1/10 | (2006.01) | |
| F21V 5/00 | (2015.01) | |
| H04L 27/02 | (2006.01) | |
| H01P 5/02 | (2006.01) | |
| H03C 1/00 | (2006.01) | |

(52) U.S. Cl.
CPC .............. *H04L 27/02* (2013.01); *H01P 5/02* (2013.01); *H03C 1/00* (2013.01)

(58) Field of Classification Search
CPC ............ H04L 27/02; H04L 27/04; H04L 25/03057; H04L 1/0054; H04L 25/08; H04L 1/203; H04L 27/01; H04L 7/042
USPC .......................................... 375/260; 362/244
See application file for complete search history.

(56) References Cited

U.S. PATENT DOCUMENTS

| | | | | | |
|---|---|---|---|---|---|
| 4,914,394 | A | * | 4/1990 | Meyer ................... | G01R 27/06 324/533 |
| 5,299,887 | A | * | 4/1994 | Ensley ................... | B09C 1/062 166/248 |
| 5,728,963 | A | * | 3/1998 | Reintjes ............... | G10H 1/0083 84/692 |
| 6,150,895 | A | * | 11/2000 | Steigerwald .............. | H01P 5/02 333/12 |

(Continued)

FOREIGN PATENT DOCUMENTS

| | | |
|---|---|---|
| JP | 10-014139 | 1/1998 |
| JP | 2010-016985 | 1/2010 |

(Continued)

*Primary Examiner* — Daniel Washburn
*Assistant Examiner* — Sarah Hassan
(74) *Attorney, Agent, or Firm* — NSIP Law

(57) ABSTRACT

Provided is data transmission and reception that transmits and receives data using a wireless power between wireless power transmitter and a wireless power receiver. An in-band data communication apparatus using a wireless power may include a modulating unit configured to modulate data by mixing a predetermined signal and pulse signal-type data; a demodulating unit configured to detect reflected power generated due to impedance mismatching between a source resonator and a target resonator, and to demodulate received data based on a variance of the reflected power; a source resonance unit configured to transmit transmission power including the modulated data to the target resonator, and to receive the reflected power; and a controller to control the pulse signal-type data, and to control impedance matching between the source resonator and the target resonator.

19 Claims, 16 Drawing Sheets

(56) References Cited

U.S. PATENT DOCUMENTS

| | | | |
|---|---|---|---|
| 6,301,128 B1 | 10/2001 | Jang et al. | |
| 7,952,322 B2 * | 5/2011 | Partovi | H01F 5/003 |
| | | | 320/108 |
| 2002/0090930 A1 * | 7/2002 | Fujiwara | G07C 9/00111 |
| | | | 455/410 |
| 2004/0095115 A1 * | 5/2004 | Kernahan | H02M 3/157 |
| | | | 323/282 |
| 2004/0218406 A1 * | 11/2004 | Jang et al. | 363/37 |
| 2005/0168987 A1 * | 8/2005 | Tamaoki | B43K 29/10 |
| | | | 362/244 |
| 2006/0164055 A1 * | 7/2006 | Hata | H02M 3/156 |
| | | | 323/282 |
| 2007/0246546 A1 * | 10/2007 | Yoshida | 235/492 |
| 2011/0148215 A1 * | 6/2011 | Marzetta et al. | 307/104 |

FOREIGN PATENT DOCUMENTS

| | | |
|---|---|---|
| KR | 10-2010-0017073 | 2/2010 |
| KR | 10-0976231 | 8/2010 |

* cited by examiner

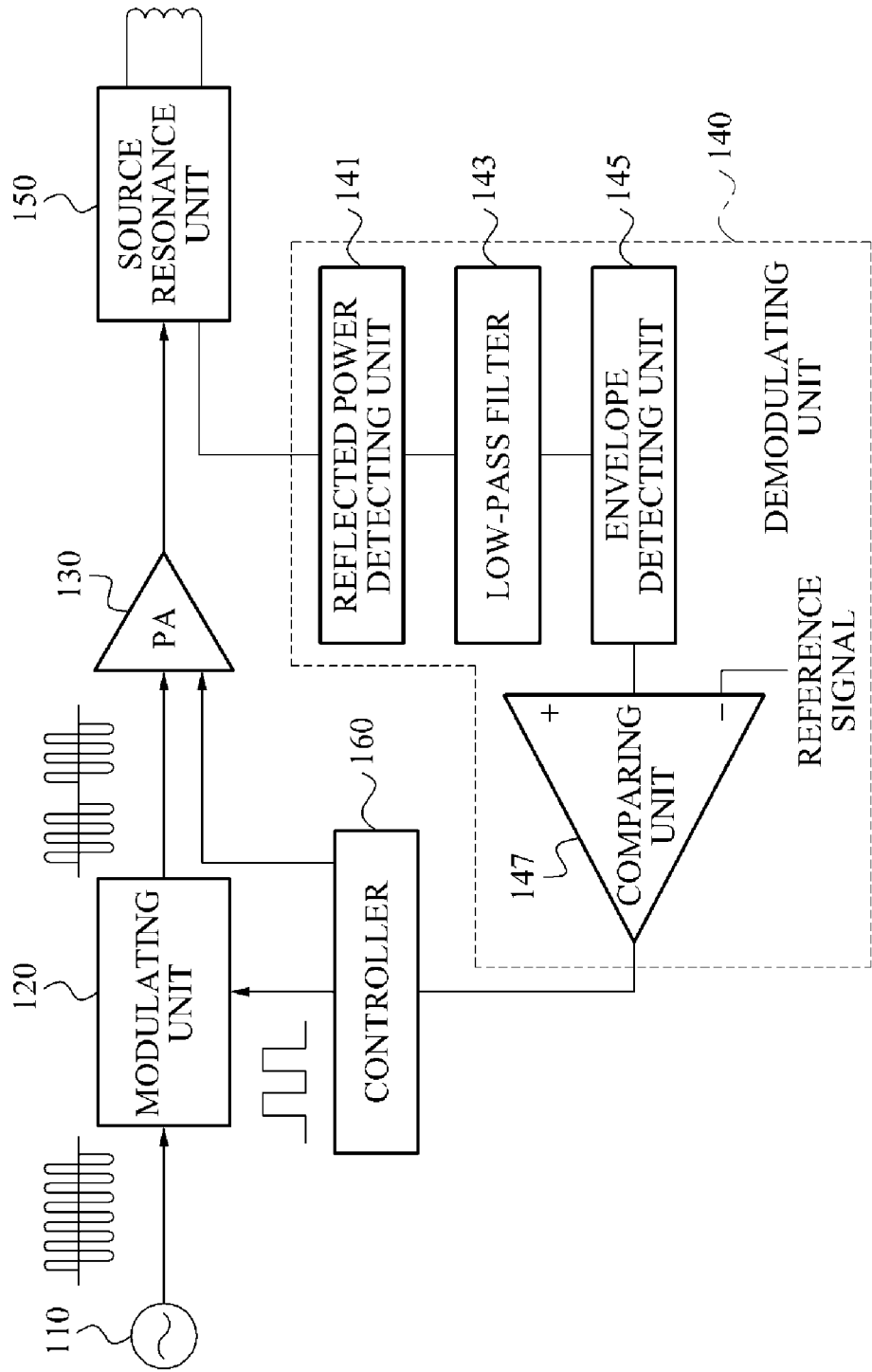

$$\omega_{MZR} = \frac{1}{\sqrt{L_R C_L}}$$

IN-BAND DATA COMMUNICATION SYSTEM USING WIRELESS POWER

CROSS-REFERENCE TO RELATED APPLICATION(S)

This application claims the benefit under 35 U.S.C. §119(a) of Korean Patent Application No. 10-2011-0050504, filed on May 27, 2011, in the Korean Intellectual Property Office, the entire disclosure of which is incorporated herein by reference for all purposes.

BACKGROUND

1. Field

The following description relates to wireless power transmission.

2. Description of Related Art

As demand for portable electrical devices has rapidly increased, use of wired power supplies for these devices has become more inconvenient. Studies on wireless power transmission have been conducted to overcome inconveniences of wired power supplies and the limited capacity of conventional batteries. One conventional wireless power transmission technology uses a resonance characteristic of a radio frequency (RF) device that may include a source that supplies power and a target that receives power.

SUMMARY

According to one general aspect, an in-band data communication apparatus using a wireless power may include: a modulating unit configured to modulate data by mixing a predetermined signal and pulse signal-type data; a demodulating unit configured to detect reflected power generated due to impedance mismatching between a source resonator and a target resonator, and to demodulate received data based on a variance of the reflected power; a source resonance unit configured to transmit transmission power including the modulated data to the target resonator, and to receive the reflected power; and a controller to control the pulse signal-type data, and to control impedance matching between the source resonator and the target resonator.

The demodulating unit may include: a reflected power detecting unit configured to detect, based on a coupling scheme, the reflected power from a signal including the transmission power and the reflected power; an envelope detecting unit configured to detect an envelope of the detected reflected power; and a comparing unit configured to compare the detected envelope with a reference value, the reference value being determined based on a minimum value of a magnitude of the detected envelope.

The reflected power detecting unit may detect the reflected power from the signal, through a coupling resistor that cuts-off power corresponding to the transmission power.

The reflected power detecting unit may include: a transmission line through which the signal flows; and a coupling line used for detecting the reflected power through coupling with the transmission line, wherein the reflected power is detected based on the distance between the transmission line and the coupling line, and/or the length of the coupling line.

The apparatus may further include: a low-pass filter configured to block a harmonic signal from the detected reflected power.

The controller may provide a reference signal to determine whether a variance of the reflected power is high or low.

According to another general aspect, an in-band data communication apparatus using a wireless power may include: a target resonance unit configured to transmit reflected power to a source resonator, and to receive reception power including data; a modulating unit configured to control a variance of the reflected power by adjusting an impedance of a target device, so as to modulate data; a demodulating unit configured to detect an envelope of the reception power, and to demodulate the received data included in the reception power by comparing the detected envelope and a predetermined reference value; and a controller configured to provide an adjustment signal for the impedance of the target device and the predetermined reference value, and to perform impedance matching between a target resonator and a load.

The modulating unit may adjust the impedance by controlling current flowing through the load.

The modulating unit may control the variance of the reflected power by adjusting the impedance through a current source operating as a variable load, so as to modulate the data.

The modulating unit may control the variance of the reflected power by adjusting the impedance through a switch connected to the load so as to modulate the data.

The demodulating unit may include: a low-pass filter configured to block a harmonic signal from the reception power; an envelope detecting unit configured to detect an envelope of the reception power; and a comparing unit configured to demodulate the received data, by comparing the detected envelope and a reference value, the reference value being determined based on a minimum value of a magnitude of the detected envelope.

The apparatus may further include: an alternating current/direct current (AC/DC) converting unit configured to convert the reception power to a DC signal.

According to yet another general aspect, an in-band data communication method using a wireless power may include: modulating a pulse signal-type data by mixing a predetermined signal and the pulse signal-type data; transmitting a transmission power including the modulated data to a target resonator, and receiving reflected power; detecting the reflected power generated due to impedance mismatching between a source resonator and the target resonator, and demodulating received data based on a variance of the reflected power; and providing the pulse signal-type data, and controlling impedance matching between the source resonator and the target resonator.

The demodulating may include: detecting the reflected power from a signal including the transmission power and the reflected power, based on a coupling scheme; detecting an envelope of the detected reflected power; and comparing the detected envelope and a reference value, the reference value being determined based on a minimum value of a magnitude of the detected envelope.

The detecting may include: detecting the reflected power from the signal, through a coupling resistor that blocks power corresponding to the transmission power.

The detecting may include: utilizing a transmission line through which the signal flows and a coupling line for detecting the reflected power through coupling with the transmission line, wherein the reflected power is detected based on the distance between the transmission line and the coupling line, and/or the length of the coupling line.

According a further general aspect, an in-band data communication method using a wireless power may include: modulating data by controlling a variance of reflected power through adjusting an impedance of a target device; transmitting the reflected power to a source resonator, and receiving a reception power including data; detecting an envelope of the reception power, and demodulating the received data included in the reception power by comparing the detected envelope and a predetermined reference value; and providing an adjustment signal of the impedance of the target device and the predetermined reference value, and controlling impedance matching between a target resonator and a load.

The modulating may include: adjusting the impedance by controlling current flowing through the load.

The modulating may include: controlling the variance of the reflected power by adjusting the impedance through a current source operating as a variable load.

The modulating may include: controlling the variance of the reflected power by adjusting the impedance through a switch connected to the load.

Other features and aspects may be apparent from the following detailed description, the drawings, and the claims.

BRIEF DESCRIPTION OF THE DRAWINGS

FIG. 1 is a block diagram illustrating an in-band data communication apparatus using wireless power.

Figure 2A:
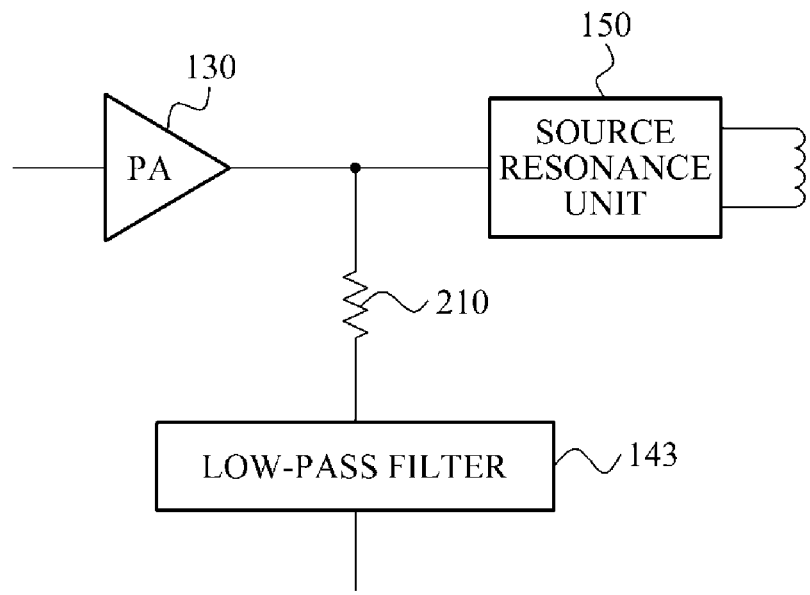
FIGS. 2A and 2B are diagrams illustrating a configuration of a reflected power detecting unit.

Throughout the drawings and the detailed description, unless otherwise described, the same drawing reference numerals should be understood to refer to the same elements, features, and structures. The relative size and depiction of these elements may be exaggerated for clarity, illustration, and convenience.

DETAILED DESCRIPTION

The following detailed description is provided to assist the reader in gaining a comprehensive understanding of the methods, apparatuses and/or systems described herein. Accordingly, various changes, modifications, and equivalents of the systems, apparatuses and/or methods described herein may be suggested to those of ordinary skill in the art. The progression of processing steps and/or operations described is an example; however, the sequence of and/or operations is not limited to that set forth herein and may be changed as is known in the art, with the exception of steps and/or operations necessarily occurring in a certain order. Also, descriptions of well-known functions and constructions may be omitted for increased clarity and conciseness.

FIG. 1 illustrates an in-band data communication apparatus using wireless power.

Referring to FIG. 1, the in-band data communication apparatus includes a frequency generating unit 110, a modulating unit 120, a power amplifier (PA) 130, a demodulating unit 140, a source resonance unit 150, and a controller 160.

The frequency generating unit 110 may generate a resonance frequency for signal transmission between a source resonator and a target resonator. In one or more embodiments, the resonance frequency may be determined by the controller 160. The controller 160 may obtain information associated with reception power of the target resonator through a signal demodulated by the modulating unit 140, for instance. The controller 160 may be configured to calculate the wireless power transmission efficiency based on transmission power of the source resonator and the reception power of the target resonator, and may determine the resonance frequency to enable the wireless power transmission efficiency to have a maximum value. The frequency generating unit 110 may generate the resonance frequency determined by the controller 160.

As used herein, power transmitted from the source resonator to the target resonator may be referred to as "transmission power," and power received by the target resonator may be referred to as "reception power." The term "in-band" communication(s), as used herein, means communication(s) in which information (such as, for example, control information, data and/or metadata) is transmitted in the same frequency band, and/or on the same channel, as used for power transmission. According to one or more embodiments, the frequency may be a resonance frequency. And, the term "out-band" communication(s), as used herein, means communication(s) in which information (such as, for example, control information, data and/or metadata) is transmitted in a separate frequency band and/or using a separate or dedicated channel, than used for power transmission.

The modulating unit 120 may be configured to multiplex or mix a predetermined signal, such as an alternating current (AC) signal, and a pulse signal-type data, so as to modulate the data. The modulating unit 120 may mix the predetermined AC signal generated from the frequency generating unit 110 and the pulse signal-type data provided from the controller 160 so as to modulate the data. The controller 160 may generate the pulse signal-type data having pulses, one or more of which have differing widths. The modulating unit 120 may modulate the data based on the width of a pulse. For instance, the modulating unit 120 may be configured to be a mixer that mixes the predetermined AC signal and the pulse signal-type data. For example, when a pulse signal, which may have a high value or a low value, has a high value, the modulating unit 120 may modulate the data by enabling the predetermined AC signal to have a great magnitude of amplitude.

The PA 130 may amplify the AC signal to have a predetermined magnitude of amplitude, based on a control signal of the controller 160. The PA 130 may use the AC signal as an input signal, and may output power having a predetermined magnitude of amplitude based on a magnitude of a driving voltage. The controller 160 may determine the amplifying level of the AC signal, based on a change in an impedance of a target device. The controller 160 may determine the amplifying level of the AC signal, based on the power transmission efficiency between the source resonator and the target resonator. In some implementations, the controller 160 may determine the amplifying level of the AC power based on noise between the source resonator and the target resonator.

The demodulating unit 140 may detect reflected power generated due to impedance mismatching between the source resonator and the target resonator, and may demodulate received data based on a variance of the reflected power. The variance of the reflected power may reflect the received data and thus, the demodulating unit 140 may determine, based on a reference signal, whether the variance of the reflected power is high or low and may demodulate the received data.

When the impedance of the target resonator changes from impedance matching between the source resonator and the target resonator, an impedance mismatch between the source resonator and the target resonator may occur. When the impedance mismatching occurs, a portion of power transmitted from the source resonator may be returned as a result of being reflected from the target resonator. And when the impedance associated with the target resonator changes, an amount of the reflected power may vary based on the change in the impedance. The received data may be demodulated based on the change in the amount of the reflected power.

The demodulating unit 140 may include a reflected power detecting unit 141, a low-pass filter 143, an envelope detecting unit 145, and a comparing unit 147.

The reflected power detecting unit 141 may detect, through coupling with the reflected power, the reflected power from an AC signal including the transmission power transmitted from the source resonance unit 150 and the reflected power received by the source resonance unit 150. The reflected power detecting unit 141 may receive, from the controller 160, a complex conjugate signal corresponding to a transmission power signal, and may remove the transmission power from the AC signal so as to detect the reflected power.

The reflected power detecting unit 141 may detect the reflected power through a coupling resistor that blocks power corresponding to the transmission power from the AC signal.

The reflected power detecting unit 141 may include a transmission line through which the AC signal flows and a coupling line, and may detect the reflected power based on a distance between the transmission line and the coupling line and the length of the coupling line. The coupling line may be used for detecting the reflected power through coupling with the transmission line.

The low-pass filter 143 may be configured to block one or more harmonic signals from the reflected power detected by the reflected power detecting unit 141.

The envelope detecting unit 145 may detect an envelope of the reflected power detected by the reflected power detecting unit 141. For instance, the envelope may be detected by a maximum magnitude of the amplitude of a reflected power signal.

The comparing unit 147 may compare the envelope detected by the envelope detecting unit 145 and a reference value. The reference value may be determined based on a minimal value of a magnitude of the detected envelope. For example, when the minimum value of the magnitude of the envelope is '0', the reference value may be determined to be '0.' The comparing unit 147 may determine a period during which the magnitude of the detected envelope is greater than the reference value, as 'HIGH', and may determine a period during which the magnitude of the detected envelope is less than the reference value, as 'LOW.' The comparing unit 147 may output a value of '1' when the magnitude of the detected envelope is greater than the reference value, and may output a value of '0' when the magnitude of the detected envelope is less than the reference value.

The controller 160 may obtain demodulated received data by receiving a value outputted from the comparing unit 147.

The received data may include state information associated with the target device, an identification (ID) of the target device, and information associated with reception power. The state information associated with the target device may include a charging level of a battery of the target device, a required power level, and/or the like. The state information associated with the target device may also include information required for improving wireless power transmission efficiency for wireless power transmitted from the source resonator.

The source resonance unit 150 may transfer electromagnetic energy to the target resonator. The source resonance unit 150 may transmit transmission power through magnetic coupling with the target resonator, and may receive reflected power from the target resonator. The source resonance unit 150 may transmit the modulated data using transmission power. And the source resonance unit 150 may receive data using the reflected power.

The controller 160 may provide, to the modulating unit 120, pulse signal-type data. The controller 160 may control impedance matching between the source resonator and the target resonator. The controller 160 may perform impedance matching based on information for the impedance matching. For example, received data may include the information for the impedance matching. The information for impedance matching may include the distance between the source resonator and the target resonator, locations of the source resonator and the target resonator, a load impedance difference, a reflection coefficient of a wave radiated from the source resonator to the target resonator, a power transmission gain, a coupling efficiency, and the like.

The controller 160 may provide, to the comparing unit 147, the reference signal that determines whether the variance of the reflected power is high or low.

In one or more embodiments, the source resonator and the target resonator may be configured as a helix coil-structured resonator, a spiral coil-structured resonator, or a meta-structured resonator. Other configurations for the respective resonator structures are also possible.

The source resonator and the target resonator may be resonators that will be described with reference to FIGS. 8 through 14, and the source resonator may wirelessly transmit power through a propagated wave to the target resonator.

Figure 2B:
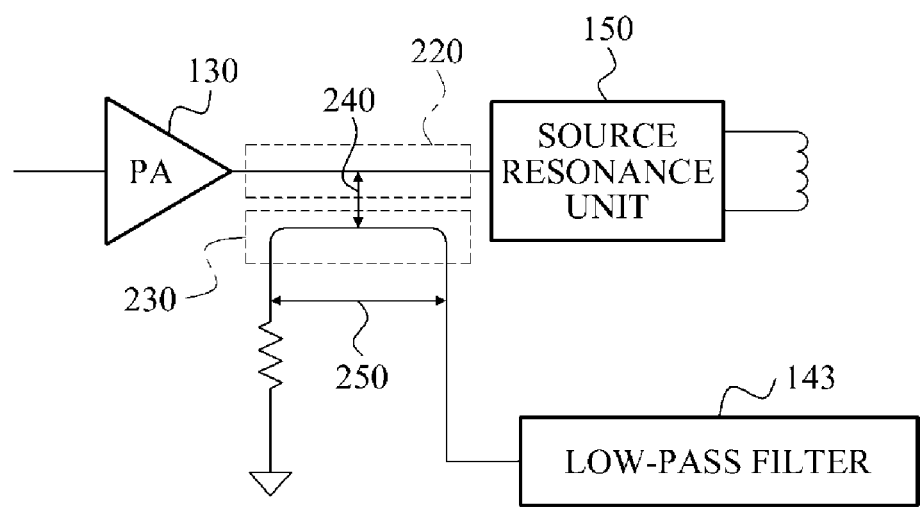

FIGS. 2A and 2B illustrate configurations of the reflected power detecting unit illustrated in FIG. 1.

Referring to FIG. 2A, the reflected power detecting unit 141 may detect a reflected power using a coupling resistor 210. The coupling resistor 210 may be configured to block power corresponding to transmission power from an AC signal including the transmission power and the reflected power. The coupling resistor 210 may cause a voltage drop corresponding to the transmission power so as to offset the transmission power from the AC signal.

Referring to FIG. 2B, the reflected power detecting unit 141 includes a transmission line 220 through which the AC signal flows and a coupling line 230. The reflected power detecting unit 141 may be configured to detect the reflected power based on a distance 240 between the transmission line 220 and the coupling line 230 and a length 250 of the coupling line 230. The coupling line 230 may be used for detecting the reflected power through coupling with the transmission line 220. The reflected power detecting unit 141 may detect a stronger reflected power through the coupling, as the distance 240 between the transmission line 220 and the coupling line 230 becomes narrower and the length 250 of the coupling line becomes longer. The reflected power detecting unit 141 may detect the reflected power received by the source resonance unit 150 in the direction of the low-pass filter 143. The reflected power detecting unit 141 may detect power outputted from the PA 130 in the direction of a resistor.

The reflected power detecting unit 141 may cause a voltage drop corresponding to the transmission power through the resistor from power detected using the coupling line 230 and thus, may offset a portion of the transmission power corresponding to the transmission power from the detected power.

The transmission line 220 and the coupling line 230 may be formed as laminated-structured substrates, for example.

Figure 3:
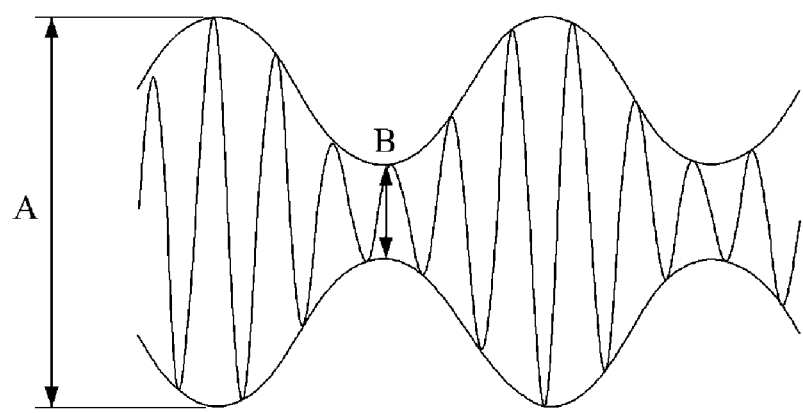
FIG. 3 is a diagram illustrating a waveform of reflected power detected by a reflected power detecting unit.

FIG. 3 illustrates a waveform of reflected power detected by a reflected power detecting unit.

Referring to FIG. 3, 'A' denotes the maximum value of the amplitude of the reflected power detected by the reflected power detecting unit, and 'B' denotes the minimum value of the amplitude of the reflected power. A wireless power receiver including a target device and a target resonator may change a current source connected to a load in parallel so as to control an index. The index may be calculated by [(A−B)/(A+B)]×100. In some instances, 'B' may be determined by a control of the current source that acts as an active load included in the wireless power receiver.

A demodulating unit may be configured to determine whether 'A' and 'B' are high or low based on a reference signal, and may demodulate received data.

Figure 4:
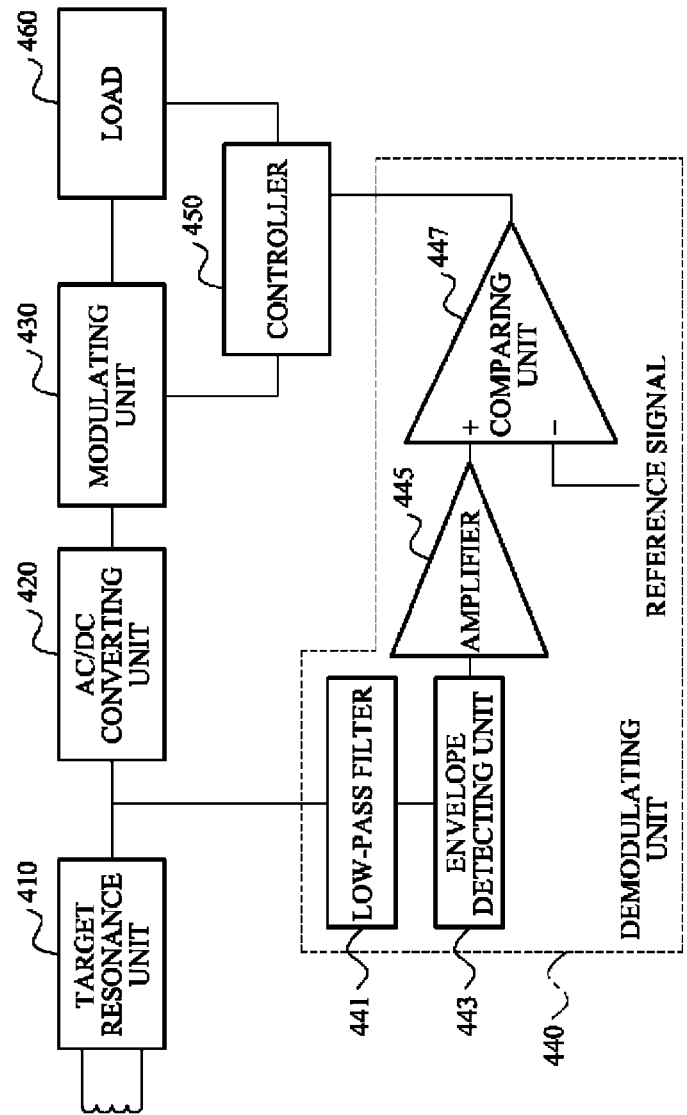
FIG. 4 is a block diagram illustrating an in-band data communication apparatus using wireless power.

FIG. 4 illustrates an in-band data communication apparatus using wireless power.

Referring to FIG. 4, the in-band data communication apparatus includes a target resonance unit 410, an alternating current/direct current (AC/DC) converting unit 420, a modulating unit 430, a demodulating unit 440, and a controller 450.

The target resonance unit 410 may transmit reflected power through magnetic coupling with a source resonator, and may receive reception power including data. The reflected power may be power that is not received by the target resonance unit 410 and is reflected from the target resonance unit 410, among power transmitted from the source resonator. A source device may transmit data using wireless power. The target resonance unit 410 may receive the wireless power and thus, may receive the data using the wireless power.

The AC/DC converting unit 420 may convert the reception power to a DC signal. In one or more embodiments, the AC/DC converting unit 420 may be configured as a rectifier. The AC/DC converting unit 420 may convert an AC signal to a DC signal. For example, the reception power may be an AC signal corresponding to a resonance frequency including power and thus, the AC/DC converting unit 420 may convert the reception power to the DC signal.

The modulating unit 430 may modulate data by controlling a variance of the reflected power through adjusting an impedance of a target device. In some instances, when the impedance of the target device changes, impedance mismatching between the source device and the target device may occur, which in turn, may cause a change in an amount of the reflected power from the target resonance unit 410 to occur. The modulating unit 430 may modulate the data by adjusting the variance of the reflected power.

In various implementations, the modulating unit 430 may modulate the data using an index of the reflected power. The index of the reflected power may be based on a ratio of the maximum value of the amplitude of the reflected power and the minimum value of the amplitude of the reflected power. For instance, the modulating unit 430 may modulate the data by adjusting the maximum value of the amplitude of the reflected power, the minimum value of the amplitude of the reflected power, or both.

The demodulating unit 440 may detect an envelope of the reception power, may compare the detected envelope and a predetermined reference value, and/or may demodulate the received data. For example, the demodulating unit 440 may determine a period during which the magnitude of the detected envelope is greater than the reference value to be 'HIGH' when a magnitude of the detected envelope is greater than the predetermined reference value, and may determine a period during which the magnitude of the detected envelope is less than the reference value as 'LOW' when the magnitude of the detected envelope is less than the predetermined reference value and thus, may demodulate the received data. For example, 'HIGH' may correspond to a bit '1', and 'LOW' may correspond to a bit '0', or 'HIGH' may correspond to a bit '0' and 'LOW' may correspond to a bit '1.' The foregoing settings may be set in the controller 450 in advance, in some instances. The settings may also be shared between the source device and the target device. The predetermined reference value may be provided by the controller 450. In some instances, the predetermined reference value may be a predetermined value or may be set based on the magnitude of the detected envelope.

The demodulating unit 440 may include a low-pass filter 441, an envelope detecting unit 443, an amplifying unit 445, and a comparing unit 447. The low-pass filter 441 may be configured to block a harmonic signal from the reception power. The power transmitted from the source device may include the harmonic signal due to a transmission channel between the source device and the target device, a parasitic current generated from the target resonator, and the like. The harmonic signal may distort data transmitted from the source device and thus, the harmonic signal may be blocked so as to improve efficiency of the demodulating.

The envelope detecting unit 443 may detect an envelope of the reception power. The envelope may denote a line obtained by connecting end points of waveforms of a reception power signal. The envelope may roughly show a modulation level of the received data.

The amplifier 445 may be configured to amplify the detected envelope to a value that may be compared with the reference value. In some instances, the detected envelope may be a small signal having a miniscule magnitude. As such, the amplifier 445 may amplify the amplitude of the detected envelope to be a value that is sufficiently large to be compared with the reference value.

The comparing unit 447 may compare the magnitude of the detected envelope and the reference value so as to demodulate the received data. The comparing unit 447 may output 'HIGH' or 'LOW' by comparing the magnitude of the detected envelope and the reference value. For example, the reference value may be determined based on the minimal value of the magnitude of the detected envelope. The demodulating unit 440 may be configured to demodulate the received data based on whether 'HIGH' or 'LOW' is outputted from the comparing unit 447. The controller 440 may receive the outputs from the comparing unit 447 so as to demodulate the received data.

The controller 450 may provide a control signal for the impedance of the target device. The modulating unit 430 may modulate data using a change in the impedance. The controller 450 may adjust the amount of current flowing through a variable load. The impedance may change based on the amount of current flowing through the variable load. For example, the controller 450 may adjust the amount of energy stored in a battery, and the impedance may change based on the amount of energy stored in the battery. The controller 450 may provide the predetermined reference value to the comparing unit 447. The controller 450 may perform impedance matching between the target resonator and a load 460. The controller 450 may perform impedance matching so as to efficiently transfer, to the load 460, the reception power received by the target resonator.

Figure 5A:
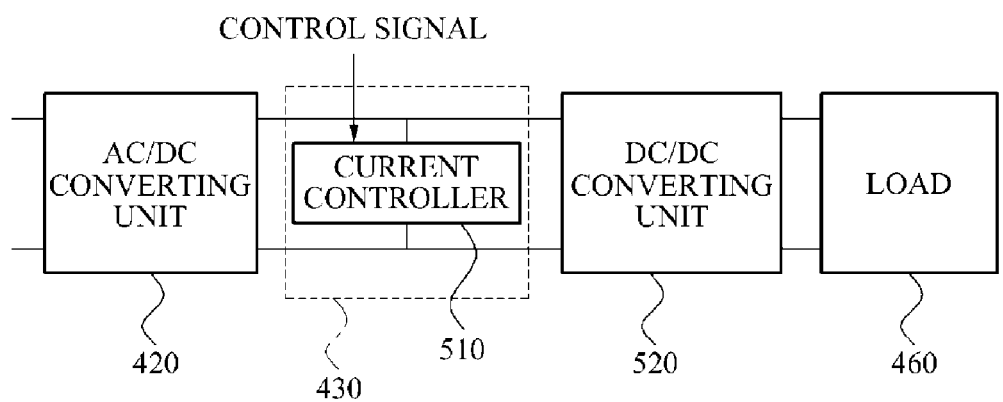
FIGS. 5A through 5C are diagrams illustrating a configuration of a modulating unit.
Figure 5B:
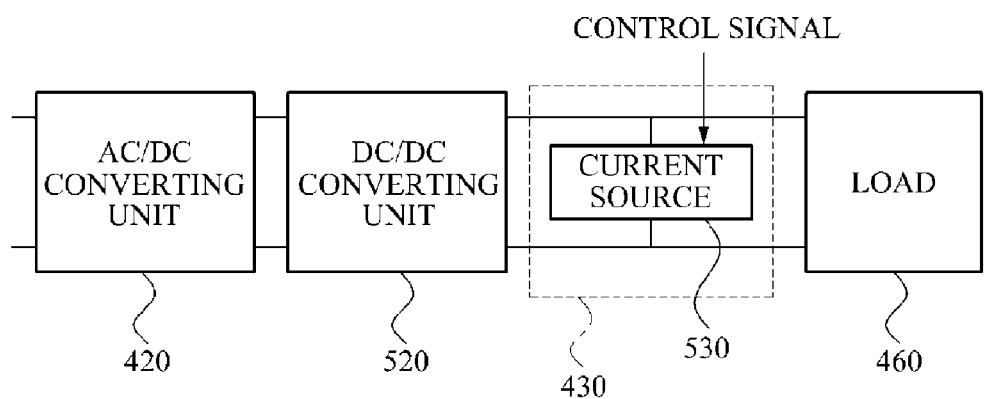
Figure 5C:
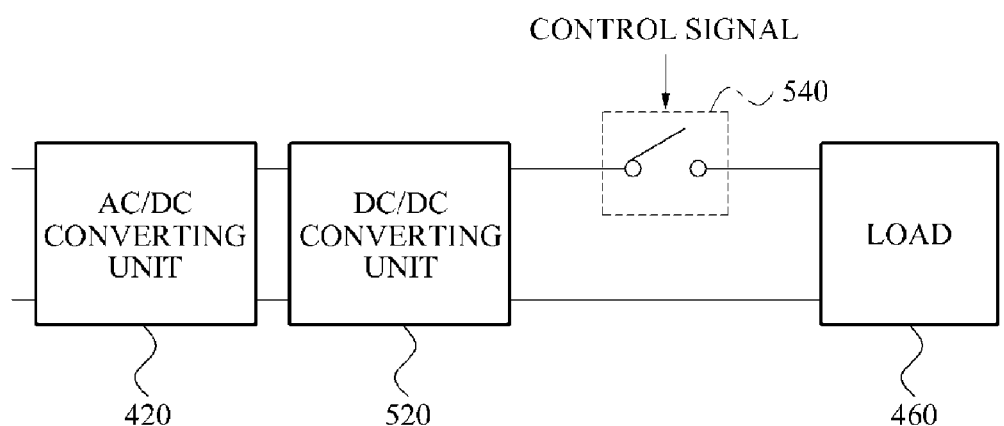

FIGS. 5A through 5C illustrate configurations of a modulating unit.

Referring to FIGS. 5A through 5C, the modulating unit 430 may include a current controller 510 that controls an impedance of a target device by controlling the current flowing through the load 460 of the target device. When current flows through the current controller 510, a change in an amount of the current flowing through the load 460 may occur, which in turn, may cause the impedance of the target device to also change. The demodulating unit 430 may demodulate data using the change in the impedance. The current controller 510 may be located at a front end of a DC/DC converting unit 520. The DC/DC converting unit 520 may convert a DC signal to a DC level required by the load 460. Reception power may be converted to a DC signal in the AC/DC converting unit 420.

The modulating unit 430 may modulate the data by controlling a variance of a reflected power from a target resonator through adjusting the impedance of the target device through a current source 530 operating as a variable load. The current source 530 may be located, for example, at a back end of the DC/DC converting unit 520. When current flows through the current source 530, the current source 530 operates as a variable load and thus, may change the impedance of the target device. The variance of the reflected power may be determined based on the change in the impedance and thus, the modulating unit 430 may adjust the amount of current flowing through the current source 530 so as to modulate the data.

The modulating unit 430 may modulate the data by controlling the variance of the reflected power from the source resonator through adjusting the impedance of the target device using an ON and OFF switch 540 connected to the load 460 of the target device. When the load 460 is connected to the DC/DC converting unit 520 or when the load 460 is not connected to the DC/DC converting unit 520, the impedance of the target device may change. The modulating unit 430 may modulate the data using the ON and OFF switch 540.

Figure 6:
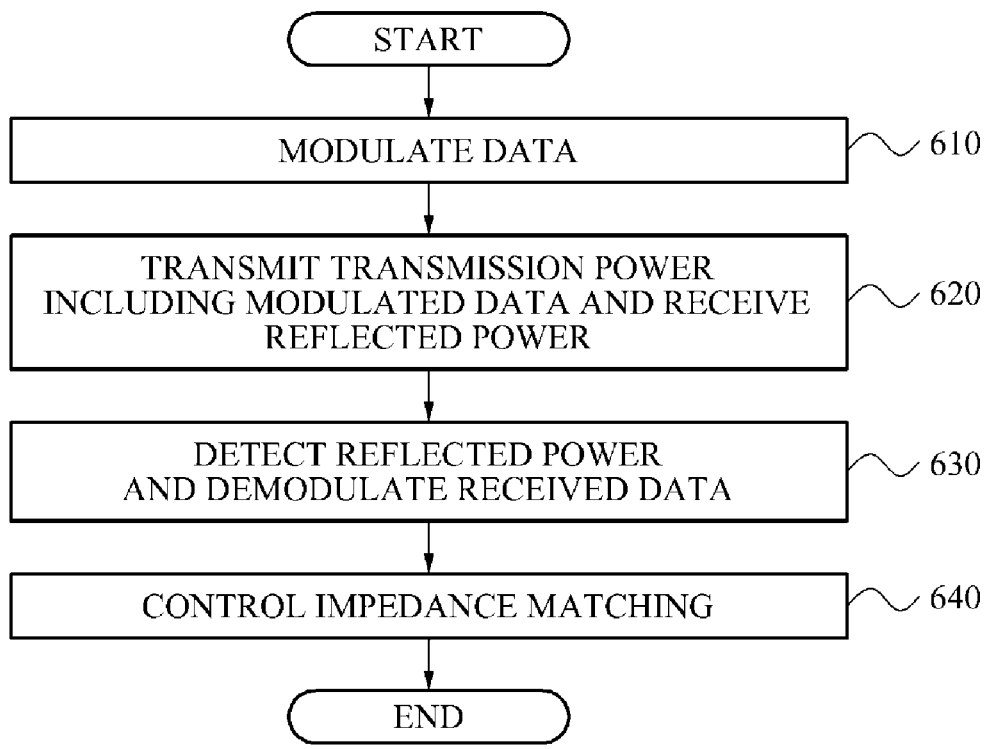
FIG. 6 is a flowchart illustrating an in-band data communication method using wireless power.

FIG. 6 illustrates an in-band data communication method using wireless power.

In operation 610, the in-band data communication apparatus using wireless power may combine a predetermined AC signal and a pulse signal-type data so as to modulate the data.

In operation 620, the in-band data communication apparatus may transmit transmission power including the modulated data through magnetic coupling with a target resonator, and may receive reflected power.

In operation 630, the in-band data communication apparatus may detect the reflected power generated due to impedance mismatching between a source resonator and the target resonator, and may demodulate received data based on a variance of the reflected power.

The in-band data communication apparatus may detect the reflected power through coupling with the reflected power from an AC signal including the transmission power and the reflected power. It may detect an envelope of the detected reflected power, and may compare the detected envelope and a reference value that is determined based on the minimum value of the magnitude of the detected envelope so as to demodulate the received data.

The in-band data communication apparatus may detect the reflected power using a coupling resistor that cuts-off power corresponding to the transmission power from the AC signal.

The in-band communication device may use a transmission line through which the AC signal flows and a coupling line used for detecting the reflected power through coupling with the transmission line. The in-band communication device may detect the reflected power based on the distance between the transmission line and the coupling line and/or the length of the coupling line.

In operation 640, the in-band data communication apparatus may provide the pulse signal-type data, and may control impedance matching between the source resonator and the target resonator.

Figure 7:
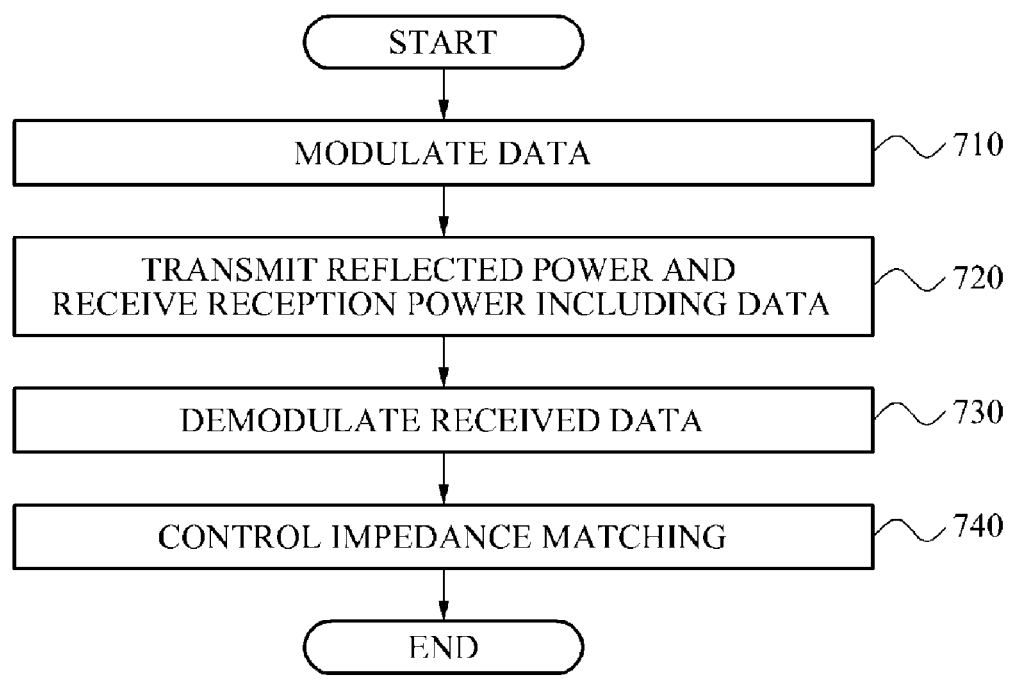
FIG. 7 is a flowchart illustrating an in-band data communication method using wireless power.

FIG. 7 illustrates an in-band data communication method using wireless power.

In operation 710, the in-band data communication apparatus may modulate data by controlling a variance of reflected power through adjusting the impedance of a target device.

The in-band data communication apparatus may control current flowing through the target device so as to adjust the impedance.

The in-band data communication apparatus may modulate the data by controlling the variance of the reflected power by adjusting the impedance through a current source operating as a variable load.

The in-band data communication apparatus may modulate the data by controlling the variance of the reflected power through adjusting the impedance using a switch connected to the load of the target device.

In operation 720, the in-band data communication apparatus may transmit the reflected power through magnetic coupling with the source resonator, and may receive a reception power including data.

In operation 730, the in-band data communication apparatus may detect an envelope of the reception power and may compare the detected envelope and a predetermined reference value so as to demodulate the received data included in the reception power.

In operation 740, the in-band data communication apparatus may provide a control signal for the impedance of the target device and the predetermined reference value, and may control impedance matching between the target resonator and the load.

FIG. 8 through FIG. 14 illustrate various resonator structures.

Figure 8:
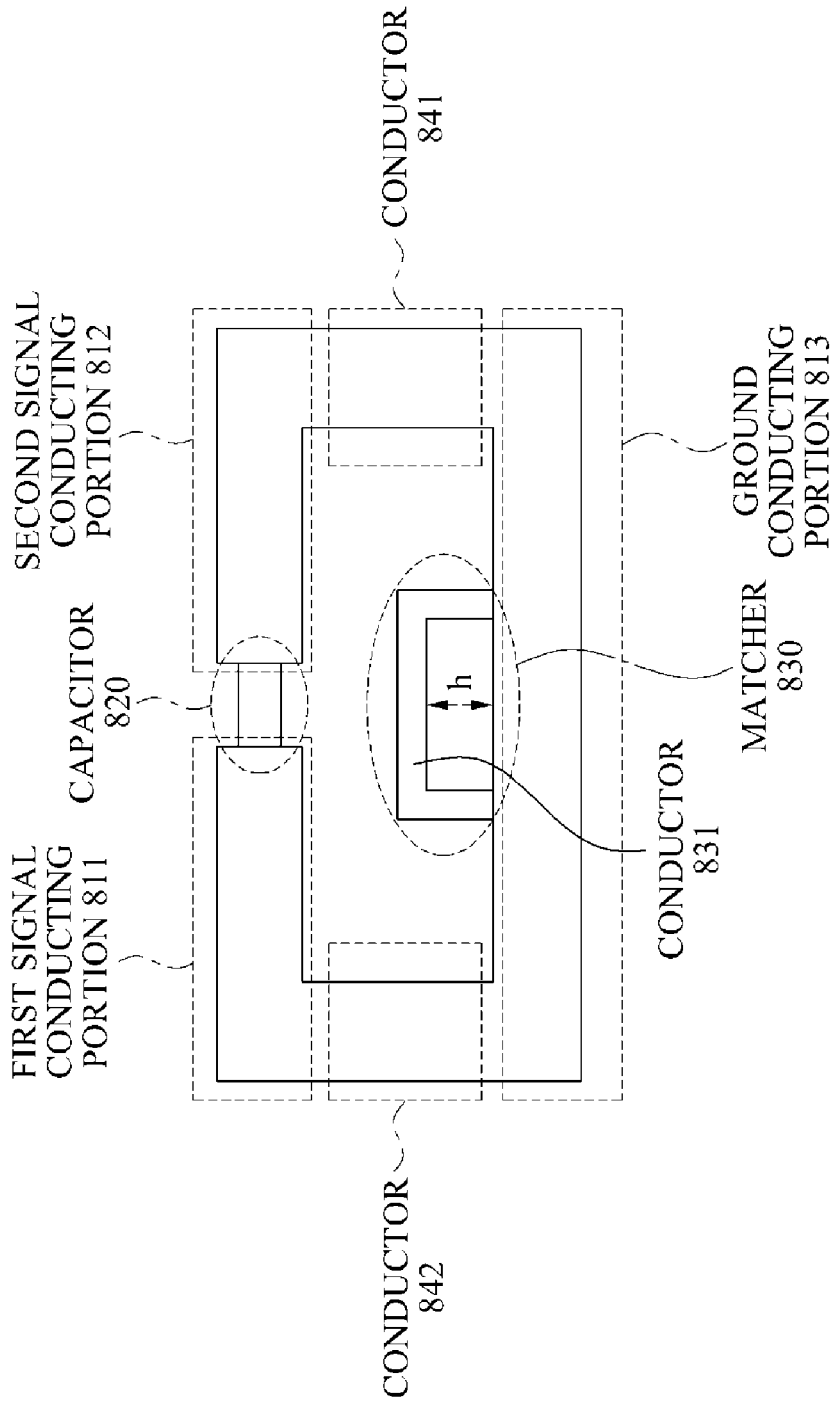
FIGS. 8 through 14 are diagram illustrating various resonator structures.

FIG. 8 illustrates a resonator 800 having a two-dimensional (2D) structure.

Referring to FIG. 8, the resonator 800 having the 2D structure may include a transmission line, a capacitor 820, a matcher 830, and conductors 841 and 842. The transmission line may include, for instance, a first signal conducting portion 811, a second signal conducting portion 812, and a ground conducting portion 813.

The capacitor 820 may be inserted or otherwise positioned in series between the first signal conducting portion 811 and the second signal conducting portion 812 so that an electric field may be confined within the capacitor 820. In various implementations, the transmission line may include at least one conductor in an upper portion of the transmission line, and may also include at least one conductor in a lower portion of the transmission line. Current may flow through the at least one conductor disposed in the upper portion of the transmission line and the at least one conductor disposed in the lower portion of the transmission may be electrically grounded. As shown in FIG. 8, the resonator 800 may be configured to have a generally 2D structure. The transmission line may include the first signal conducting portion 811 and the second signal conducting portion 812 in the upper portion of the transmission line, and may include the ground conducting portion 813 in the lower portion of the transmission line. As shown, the first signal conducting portion 811 and the second signal conducting portion 812 may be disposed to face the ground conducting portion 813 with current flowing through the first signal conducting portion 811 and the second signal conducting portion 812.

In some implementations, one end of the first signal conducting portion 811 may be electrically connected (i.e., shorted) to a conductor 842, and another end of the first signal conducting portion 811 may be connected to the capacitor 820. And one end of the second signal conducting portion 812 may be grounded to the conductor 841, and another end of the second signal conducting portion 812 may be connected to the capacitor 820. Accordingly, the first signal conducting portion 811, the second signal conducting portion 812, the ground conducting portion 813, and the conductors 841 and 842 may be connected to each other such that the resonator 800 may have an electrically closed-loop structure. The term "closed-loop structure" as used herein, may include a polygonal structure, for example, a circular structure, a rectangular structure, or the like that is electrically closed.

The capacitor 820 may be inserted into an intermediate portion of the transmission line. For example, the capacitor 820 may be inserted into a space between the first signal conducting portion 811 and the second signal conducting portion 812. The capacitor 820 may be configured in some instances, as a lumped element, a distributed element, or the like. In one implementation, a capacitor may be configured as a distributed element and may include zigzagged conductor lines and a dielectric material having a relatively high permittivity between the zigzagged conductor lines.

When the capacitor 820 is inserted into the transmission line, the resonator 800 may have a property of a metamaterial. The metamaterial indicates a material having a predetermined electrical property not ordinarily found in nature and thus, may have an artificially designed structure. An electromagnetic characteristic of all the materials existing in nature may have a unique magnetic permeability or a unique permittivity. Most materials may have a positive magnetic permeability or a positive permittivity. In the case of most materials, a right hand rule may be applied to an electric field, a magnetic field, and a pointing vector and thus, the corresponding materials may be referred to as right handed materials (RHMs). However, the metamaterial has a magnetic permeability or a permittivity absent in nature and thus, may be classified into an epsilon negative (ENG) material, a mu negative (MNG) material, a double negative (DNG) material, a negative refractive index (NRI) material, a left-handed (LH) material, and the like, based on the sign of the corresponding permittivity or magnetic permeability.

When the capacitance of the capacitor inserted as the lumped element is appropriately determined, the resonator 800 may have the characteristic of the metamaterial. For example, the resonator 800 may have a negative magnetic permeability due to the capacitance of the capacitor 820. If so, the resonator 800 may be referred to as an MNG resonator. Various criteria may be applied to determine the capacitance of the capacitor 820. For example, the various criteria for enabling the resonator 800 to have the characteristic of the metamaterial may include one or more of the following: a criterion for enabling the resonator 800 to have a negative magnetic permeability in a target frequency, a criterion for enabling the resonator 800 to have a zeroth order resonance characteristic in the target frequency, or the like. The resonator 800, also referred to as the MNG resonator 800, may also have a zeroth order resonance characteristic (i.e., having, as a resonance frequency, a frequency when a propagation constant is "0"). If the resonator 800 may has a zeroth order resonance characteristic, the resonance frequency may be independent with respect to a physical size of the MNG resonator 800. Moreover, by appropriately designing the capacitor 820, the MNG resonator 800 may sufficiently change the resonance frequency without substantially changing the physical size of the MNG resonator 800.

In a near field, for instance, the electric field may be concentrated on the capacitor 820 inserted into the transmission line. Accordingly, due to the capacitor 820, the magnetic field may become dominant in the near field. In one or more embodiments, the MNG resonator 800 may have a relatively high Q-factor using the capacitor 820 of the lumped element. Thus, it may be possible to enhance power transmission efficiency. For example, the Q-factor indicates a level of an ohmic loss or a ratio of a reactance with respect to a resistance in the wireless power transmission. The efficiency of the wireless power transmission may increase according to an increase in the Q-factor.

The MNG resonator 800 may include a matcher 830 for impedance-matching. For example, the matcher 830 may be configured to appropriately adjust the strength of a magnetic field of the MNG resonator 800, for instance. Depending on the configuration, current may flow in the MNG resonator 800 via a connector, or may flow out from the MNG resonator 800 via the connector. The connector may be connected to the ground conducting portion 813 or the matcher 830. In some instances, power may be transferred through coupling without using a physical connection between the connector and the ground conducting portion 813 or the matcher 830.

As shown in FIG. 8, the matcher 830 may be positioned within the loop formed by the loop structure of the resonator 800. The matcher 830 may adjust the impedance of the resonator 800 by changing the physical shape of the matcher 830. For example, the matcher 830 may include the conductor 831 for the impedance-matching positioned in a location that is separate from the ground conducting portion 813 by a distance h. Accordingly, the impedance of the resonator 800 may be changed by adjusting the distance h.

In some instances, a controller may be provided to control the matcher 830 which generates and transmits a control signal to the matcher 830 directing the matcher to change its physical shape so that the impedance of the resonator may be adjusted. For example, the distance h between a conductor 831 of the matcher 830 and the ground conducting portion 813 may be increased or decreased based on the control signal. The controller may generate the control signal based on various factors.

As shown in FIG. 8, the matcher 830 may be configured as a passive element such as the conductor 831, for example. Of course, in other embodiments, the matcher 830 may be configured as an active element such as a diode, a transistor, or the like. If the active element is included in the matcher 830, the active element may be driven based on the control signal generated by the controller, and the impedance of the resonator 800 may be adjusted based on the control signal.

For example, when the active element is a diode included in the matcher 830, the impedance of the resonator 800 may be adjusted depending on whether the diode is in an ON state or in an OFF state.

In one or more embodiments, a magnetic core may be further provided to pass through the MNG resonator 800. The magnetic core may increase the power transmission distance.

Figure 9:
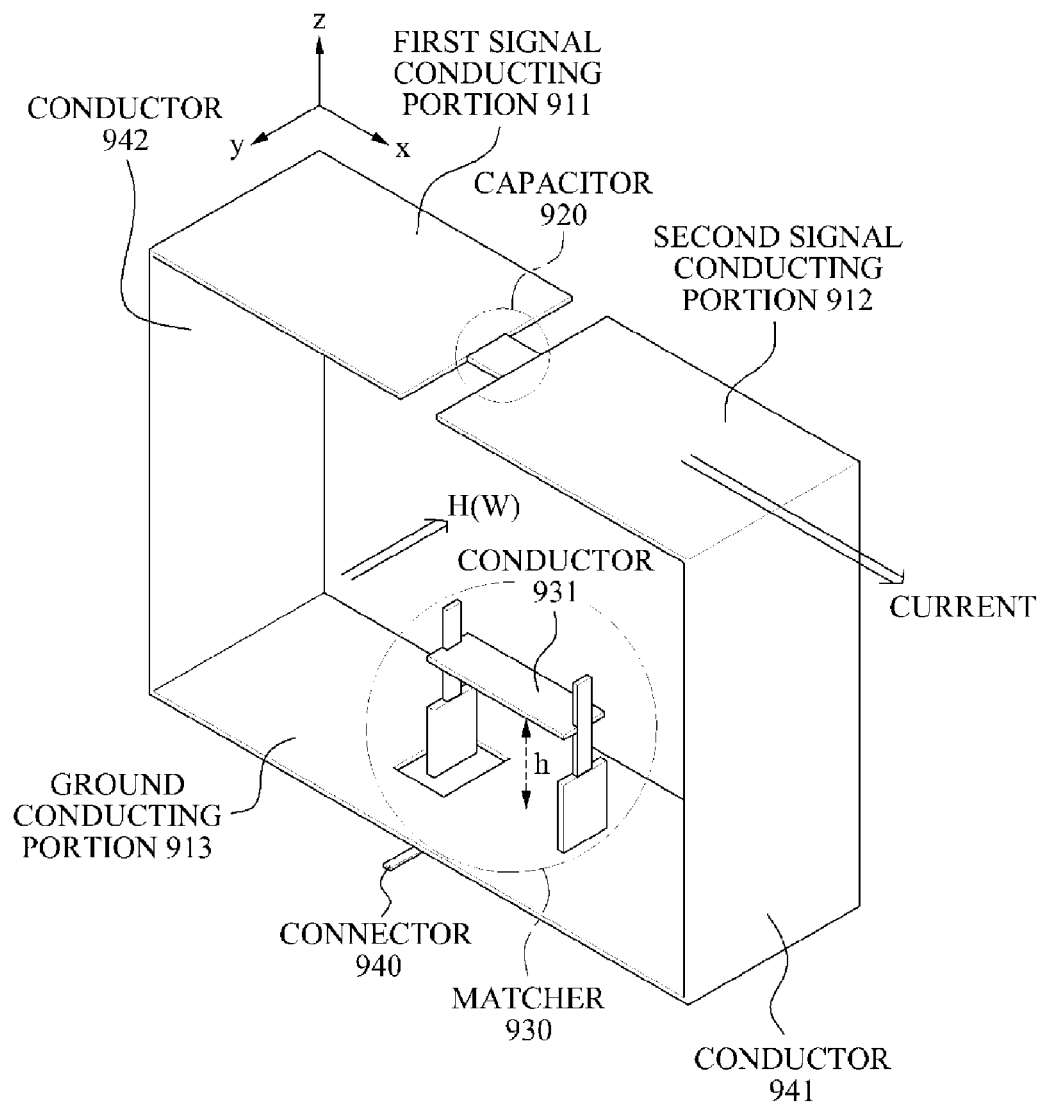

FIG. 9 illustrates a resonator 900 having a three-dimensional (3D) structure.

Referring to FIG. 9, the resonator 900 having the 3D structure may include a transmission line and a capacitor 920. The transmission line may include a first signal conducting portion 911, a second signal conducting portion 912, and a ground conducting portion 913. The capacitor 920 may be inserted, for instance, in series between the first signal conducting portion 911 and the second signal conducting portion 912 of the transmission link such that an electric field may be confined within the capacitor 920.

As shown in FIG. 9, the resonator 900 may have a generally 3D structure. The transmission line may include the first signal conducting portion 911 and the second signal conducting portion 912 in an upper portion of the resonator 900, and may include the ground conducting portion 913 in a lower portion of the resonator 900. The first signal conducting portion 911 and the second signal conducting portion 912 may be disposed to face the ground conducting portion 913. In this arrangement, current may flow in an x direction through the first signal conducting portion 911 and the second signal conducting portion 912. Due to the current, a magnetic field H(W) may be formed in a −y direction. However, it should be appreciated that the magnetic field H(W) might also be formed in the opposite direction (e.g., a +y direction) in other implementations.

In one or more embodiments, one end of the first signal conducting portion 911 may be shorted to a conductor 942, and another end of the first signal conducting portion 911 may be connected to the capacitor 920. One end of the second signal conducting portion 912 may be grounded to the conductor 941, and another end of the second signal conducting portion 912 may be connected to the capacitor 920. Accordingly, the first signal conducting portion 911, the second signal conducting portion 912, the ground conducting portion 913, and the conductors 941 and 942 may be connected to each other, whereby the resonator 900 may have an electrically closed-loop structure. As shown in FIG. 9, the capacitor 920 may be inserted or otherwise positioned between the first signal conducting portion 911 and the second signal conducting portion 912. For example, the capacitor 920 may be inserted into a space between the first signal conducting portion 911 and the second signal conducting portion 912. The capacitor 920 may be configured, for example, as a lumped element, a distributed element, or the like. In one implementation, a distributed capacitor having the shape of the distributed element may include zigzagged conductor lines and a dielectric material having a relatively high permittivity positioned between the zigzagged conductor lines.

When the capacitor 920 is inserted into the transmission line, the resonator 900 may have a property of a metamaterial, in some instances, as discussed above.

For example, when the capacitance of the capacitor inserted as the lumped element is appropriately determined, the resonator 900 may have the characteristic of the metamaterial. When the resonator 900 has a negative magnetic permeability by appropriately adjusting the capacitance of the capacitor 920, the resonator 900 may also be referred to as an MNG resonator. Various criteria may be applied to determine the capacitance of the capacitor 920. For example, the various criteria may include one or more of the following: a criterion for enabling the resonator 900 to have the characteristic of the metamaterial, a criterion for enabling the resonator 900 to have a negative magnetic permeability in a target frequency, a criterion enabling the resonator 900 to have a zeroth order resonance characteristic in the target frequency, or the like. Based on at least one criterion among the aforementioned criteria, the capacitance of the capacitor 920 may be determined.

The resonator 900, also referred to as the MNG resonator 900, may have a zeroth order resonance characteristic (i.e., having, as a resonance frequency, a frequency when a propagation constant is "0"). If the resonator 900 may have the zeroth order resonance characteristic, the resonance frequency may be independent with respect to a physical size of the MNG resonator 900. Thus, by appropriately designing or configuring the capacitor 920, the MNG resonator 900 may sufficiently change the resonance frequency without substantially changing the physical size of the MNG resonator 900.

Referring to the MNG resonator 900 of FIG. 9, in a near field, the electric field may be concentrated on the capacitor 920 inserted into the transmission line. Accordingly, due to the capacitor 920, the magnetic field may become dominant in the near field. And since the MNG resonator 900 having the zeroth-order resonance characteristic may have characteristics similar to a magnetic dipole, the magnetic field may become dominant in the near field. A relatively small amount of the electric field formed due to the insertion of the capacitor 920 may be concentrated on the capacitor 920 and thus, the magnetic field may become further dominant.

Also, the MNG resonator 900 may include a matcher 930 for impedance-matching. The matcher 930 may be configured to appropriately adjust the strength of magnetic field of the MNG resonator 900. An impedance of the MNG resonator 900 may be determined by the matcher 930. In one or more embodiments, current may flow in the MNG resonator 900 via a connector 940, or may flow out from the MNG resonator 900 via the connector 940. And the connector 940 may be connected to the ground conducting portion 913 or the matcher 930.

As shown in FIG. 9, the matcher 930 may be positioned within the loop formed by the loop structure of the resonator 900. The matcher 930 may be configured to adjust the impedance of the resonator 900 by changing the physical shape of the matcher 930. For example, the matcher 930 may include the conductor 931 for the impedance-matching in a location separate from the ground conducting portion 913 by a distance h. The impedance of the resonator 900 may be changed by adjusting the distance h.

In one or more embodiments, a controller may be provided to control the matcher 930. The matcher 930 may change the physical shape of the matcher 930 based on a control signal generated by the controller. For example, the distance h between the conductor 931 of the matcher 930 and the ground conducting portion 913 may be increased or decreased based on the control signal. Accordingly, the physical shape of the matcher 930 may be changed such that the impedance of the resonator 900 may be adjusted. The distance h between the conductor 931 of the matcher 930 and the ground conducting portion 913 may be adjusted using a variety of schemes. For example, one or more conductors may be included in the matcher 930 and the distance h may be adjusted by adaptively activating one of the conductors. Alternatively or additionally, the distance h may be adjusted by adjusting the physical location of the conductor 931 up and down. For instance, the distance h may be controlled based on the control signal of the controller. The controller may generate the control signal using one or more factors. As shown in FIG. 9, the matcher 930 may be configured as a passive element such as the conductor 931, for instance. Of course, in other embodiments, the matcher 930 may be configured as an active element such as, for example, a diode, a transistor, or the like. When the active element is included in the matcher 930, the active element may be driven based on the control signal generated by the controller, and the impedance of the resonator 900 may be adjusted based on the control signal. For example, if the active element is a diode included in the matcher 930, the impedance of the resonator 900 may be adjusted depending on whether the diode is in an ON state or in an OFF state.

In one or more embodiments, a magnetic core may be further provided to pass through the resonator 900 configured as the MNG resonator. The magnetic core may perform a function of increasing a power transmission distance.

Figure 10:
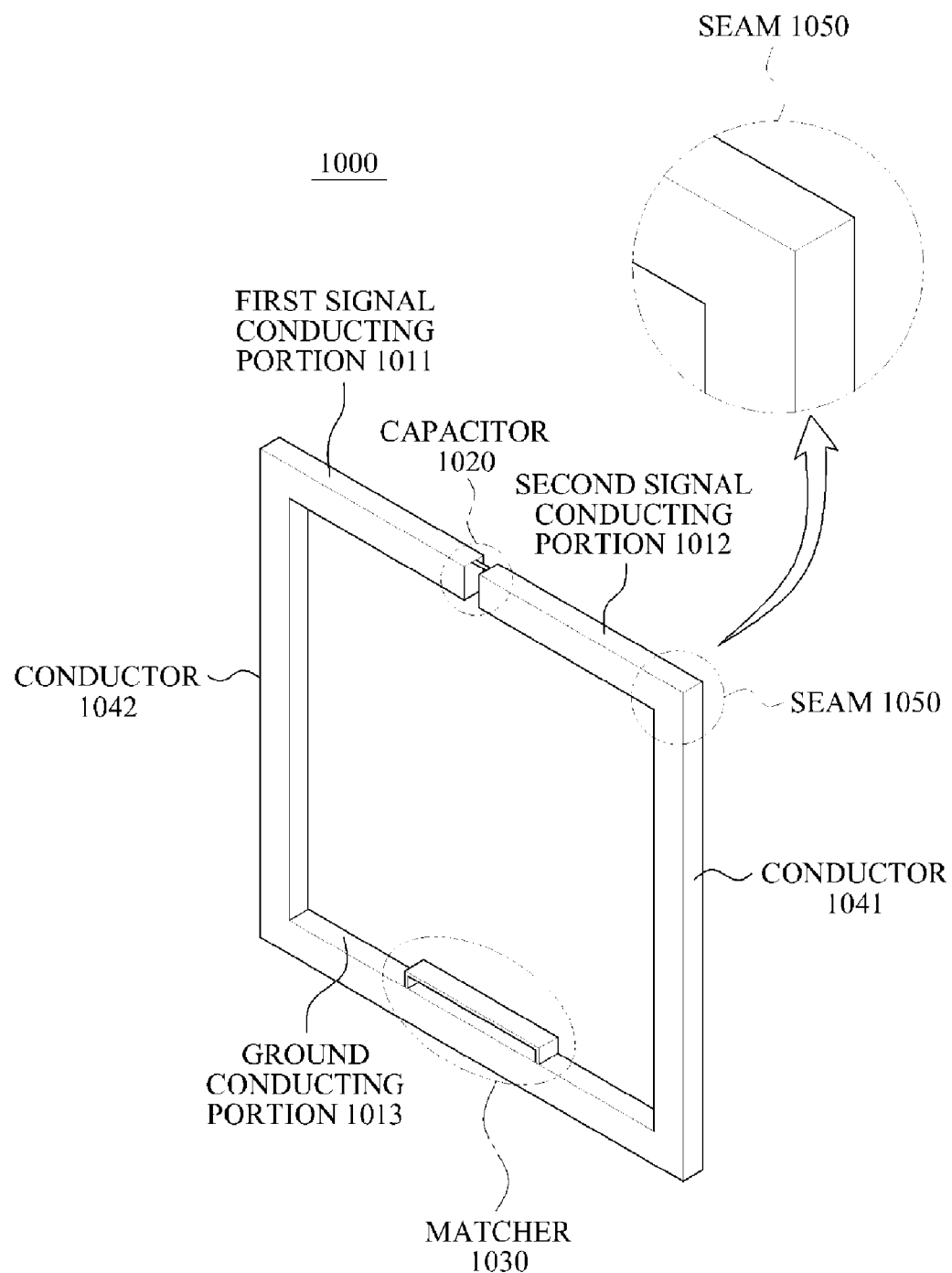

FIG. 10 illustrates a resonator 1000 for a wireless power transmission configured as a bulky type. As used herein, the term "bulky type" may refer to a seamless connection connecting at least two parts in an integrated form.

Referring to FIG. 10, a first signal conducting portion 1011 and a conductor 1042 may be integrally formed instead of being separately manufactured and thereby be connected to each other. Similarly, the second signal conducting portion 1012 and a conductor 1041 may also be integrally manufactured.

When the second signal conducting portion 1012 and the conductor 1041 are separately manufactured and then are connected to each other, a loss of conduction may occur due to a seam 1050. Thus, in some implementations, the second signal conducting portion 1012 and the conductor 1041 may be connected to each other without using a separate seam (i.e., seamlessly connected to each other). Accordingly, it may be possible to decrease conductor loss caused by the seam 1050. For instance, the second signal conducting portion 1012 and a ground conducting portion 1013 may be seamlessly and integrally manufactured. Similarly, the first signal conducting portion 1011, the conductor 1042 and the ground conducting portion 1013 may be seamlessly and integrally manufactured.

A matcher 1030 may be provided that is similarly constructed as described herein in one or more embodiments.

Figure 11:
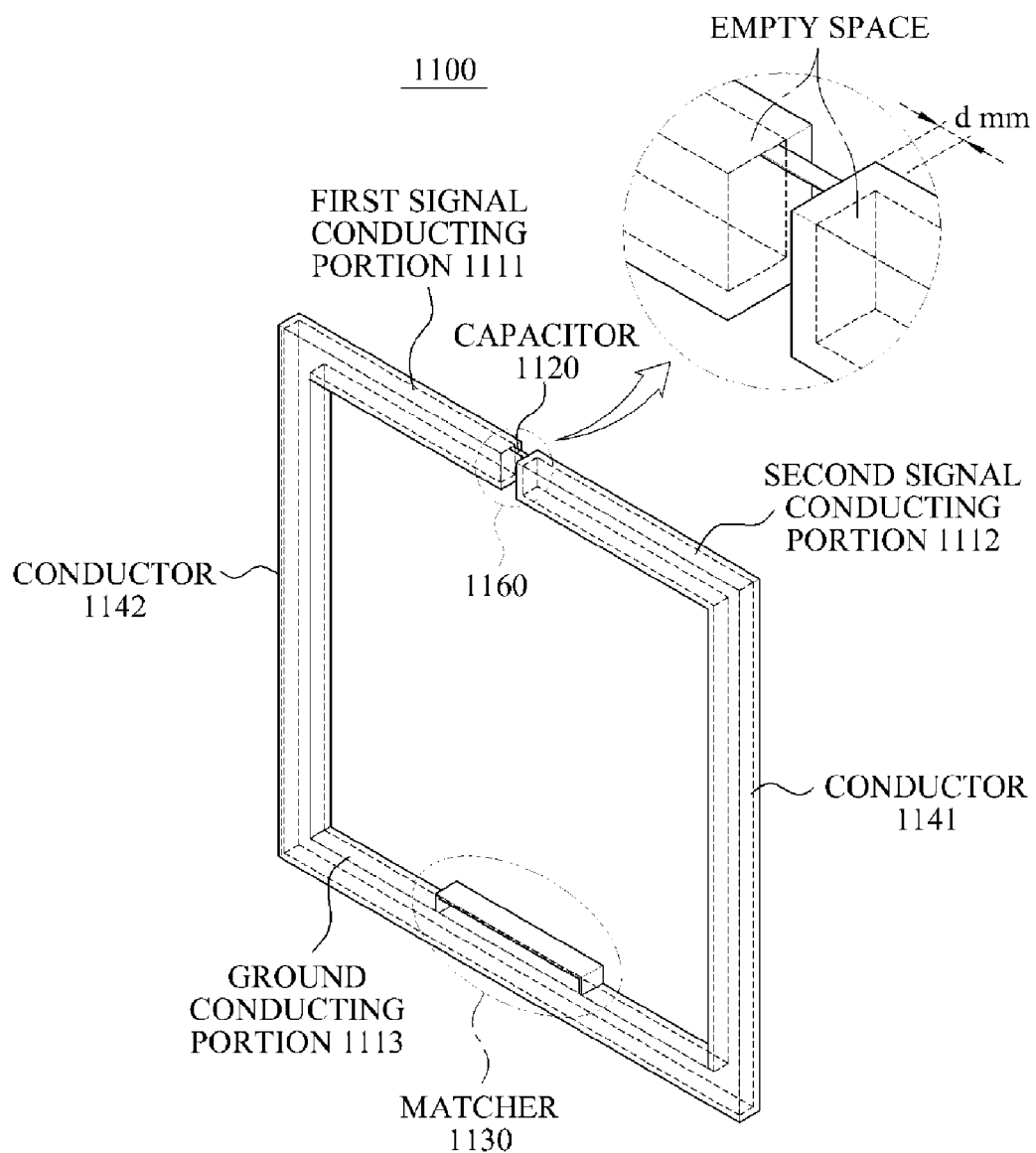

FIG. 11 illustrates a resonator 1100 for a wireless power transmission, configured as a hollow type.

Referring to FIG. 11, a first signal conducting portion 1111, a second signal conducting portion 1112, a ground conducting portion 1113, and conductors 1141 and 1142 of the resonator 1100 are configured as the hollow type structure. As used herein the term "hollow type" refers to a configuration that may include an empty space inside.

For a given resonance frequency, an active current may be modeled to flow in only a portion of the first signal conducting portion 1111 instead of all of the first signal conducting portion 1111, the second signal conducting portion 1112 instead of all of the second signal conducting portion 1112, the ground conducting portion 1113 instead of all of the ground conducting portion 1113, and the conductors 1141 and 1142 instead of all of the conductors 1141 and 1142. When the depth of one or more of the first signal conducting portion 1111, the second signal conducting portion 1112, the ground conducting portion 1113, and the conductors 1141 and 1142 are significantly deeper than a corresponding skin depth in the given resonance frequency, that depth may be ineffective. The significantly deeper depth may, however, increase the weight or manufacturing costs of the resonator 1100 in some instances.

Accordingly, for the given resonance frequency, the depth of one or more of the first signal conducting portion 1111, the second signal conducting portion 1112, the ground conducting portion 1113, and the conductors 1141 and 1142 may be appropriately determined based on the corresponding skin depth of each of the first signal conducting portion 1111, the second signal conducting portion 1112, the ground conducting portion 1113, and the conductors 1141 and 1142. When one or more of the first signal conducting portion 1111, the second signal conducting portion 1112, the ground conducting portion 1113, and the conductors 1141 and 1142 has an appropriate depth deeper than a corresponding skin depth, the resonator 1100 may weigh less, and manufacturing costs of the resonator 1100 may also decrease.

For example, as shown in FIG. 11, the depth of the second signal conducting portion 1112 (as further illustrated in the enlarged view region 1160 indicated by a circle) may be determined as "d" mm and d may be determined according to $$d = \frac{1}{\sqrt{\pi f \mu \sigma}}.$$

Here, f denotes a frequency, $\mu$ denotes a magnetic permeability, and $\sigma$ denotes a conductor constant. In one implementation, when the first signal conducting portion 1111, the second signal conducting portion 1112, the ground conducting portion 1113, and the conductors 1141 and 1142 are made of a copper and have a conductivity of $5.8 \times 10^7$ siemens per meter (S·m$^{-1}$), the skin depth may be about 0.6 mm with respect to 10 kHz of the resonance frequency and the skin depth may be about 0.006 mm with respect to 100 MHz of the resonance frequency. A capacitor 1120 and a matcher 1130 may be provided that are similarly constructed as described herein in one or more embodiments.

Figure 12:
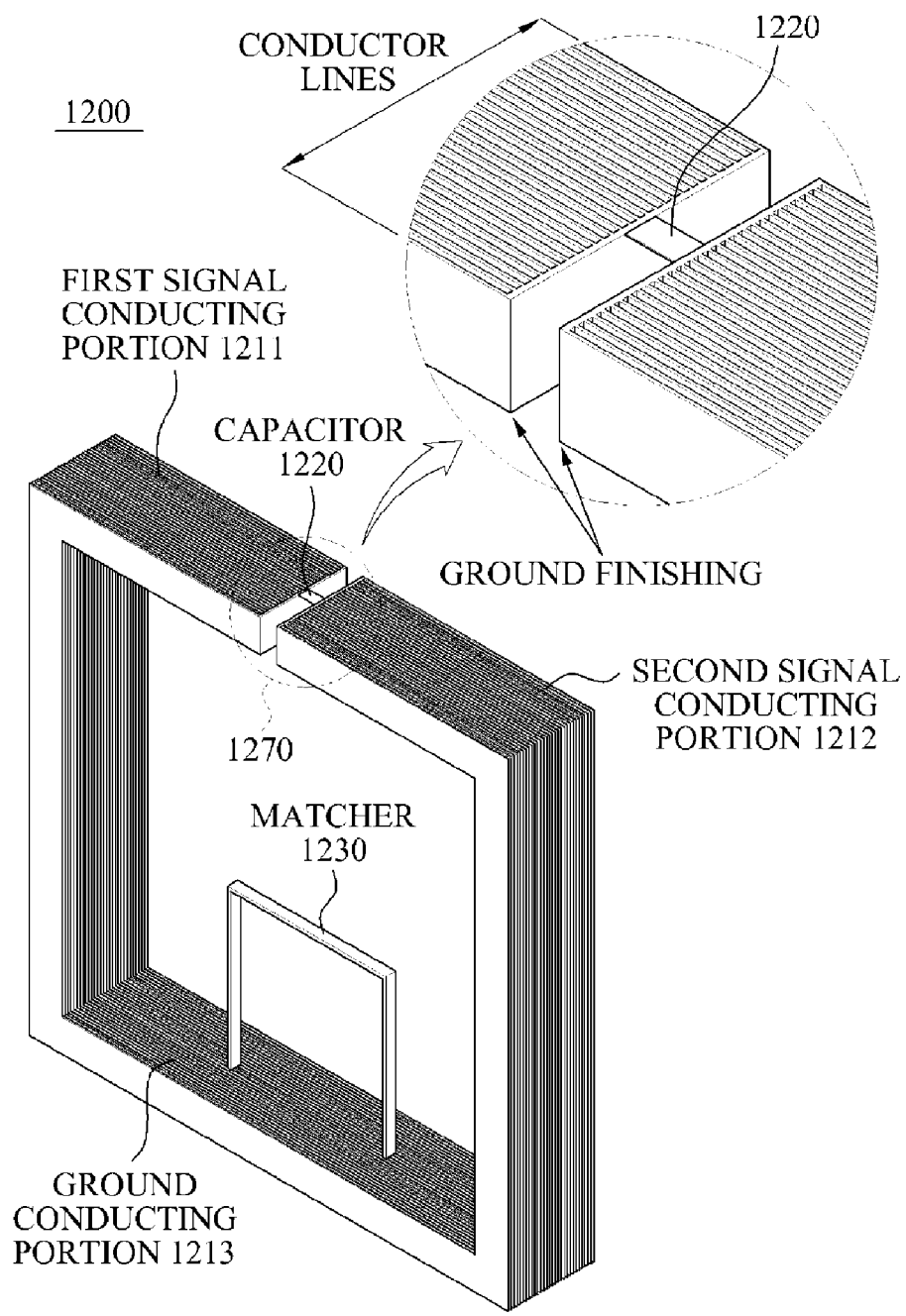

FIG. 12 illustrates a resonator 1200 for a wireless power transmission using a parallel-sheet.

Referring to FIG. 12, the parallel-sheet may be applicable to one or both of a first signal conducting portion 1211 and a second signal conducting portion 1212 included in the resonator 1200.

One of both of the first signal conducting portion 1211 and the second signal conducting portion 1212 may not be perfect conductors and thus, may have an inherent resistance. Due to this resistance, an ohmic loss may occur. The ohmic loss may decrease a Q-factor and also decrease a coupling effect.

By applying the parallel-sheet to each of the first signal conducting portion 1211 and the second signal conducting portion 1212, it may be possible to decrease the ohmic loss, and to increase the Q-factor and the coupling effect. Referring to the enlarged view portion 1270 indicated by a circle, when the parallel-sheet is applied, one or both of the first signal conducting portion 1211 and the second signal conducting portion 1212 may include a plurality of conductor lines. The plurality of conductor lines may be disposed in parallel, and may be electrically connected (i.e., shorted) at an end portion of each of the first signal conducting portion 1211 and the second signal conducting portion 1212.

When the parallel-sheet is applied to first signal conducting portion 1211 and/or the second signal conducting portion 1212, the plurality of conductor lines may be disposed in parallel. Accordingly, the sum of resistances having the conductor lines may decrease. Consequently, the resistance loss may decrease, and the Q-factor and the coupling effect may increase.

A capacitor 1220 and a matcher 1230 positioned on the ground conducting portion 1213 may be provided that are similarly constructed as described herein in one or more embodiments.

Figure 13:
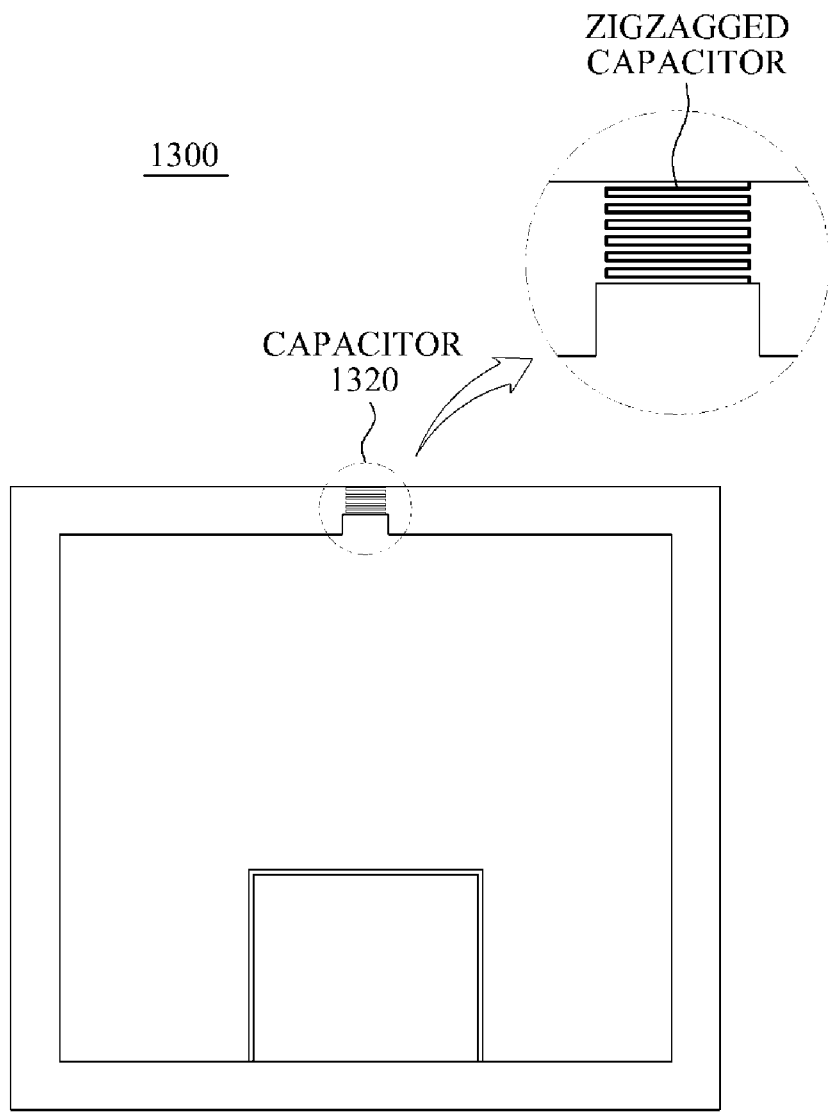

FIG. 13 illustrates a resonator 1300 for wireless power transmission, including a distributed capacitor.

Referring to FIG. 13, a capacitor 1320 included in the resonator 1300 is configured for the wireless power transmission. A capacitor used as a lumped element may have a relatively high equivalent series resistance (ESR). A variety of schemes have been proposed to decrease the ESR contained in the capacitor of the lumped element. According to an embodiment, by using the capacitor 1320 as a distributed element, it may be possible to decrease the ESR. As will be appreciated, a loss caused by the ESR may in turn decrease a Q-factor and a coupling effect.

As shown in FIG. 13, the capacitor 1320 may be configured as a conductive line having the zigzagged structure.

By employing the capacitor 1320 as the distributed element, it may be possible to decrease the loss occurring due to the ESR in some instances. In addition, by disposing a plurality of capacitors as lumped elements, it may be possible to decrease the loss occurring due to the ESR. Since the resistance of each of the capacitors as the lumped elements decreases through a parallel connection, active resistances of parallel-connected capacitors as the lumped elements may also decrease whereby the loss occurring due to the ESR may decrease. For example, by employing ten capacitors of 1 pF each instead of using a single capacitor of 10 pF, it may be possible to decrease the loss occurring due to the ESR in some instances.

Figure 14A:
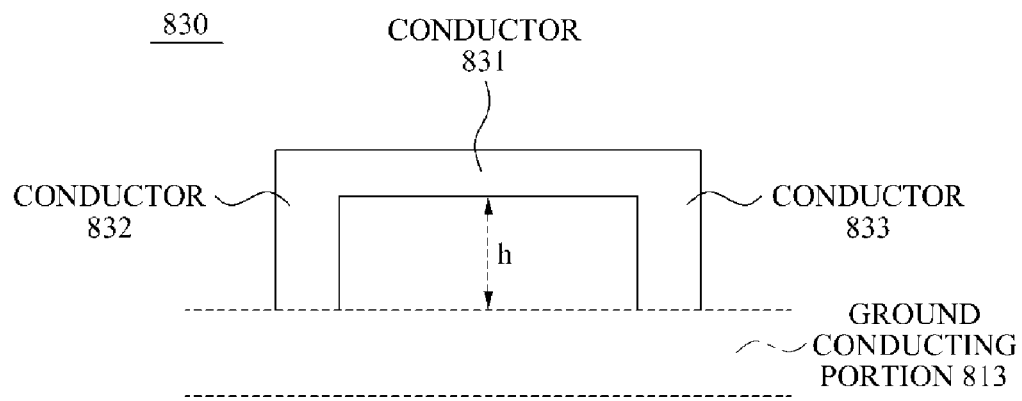
Figure 14B:
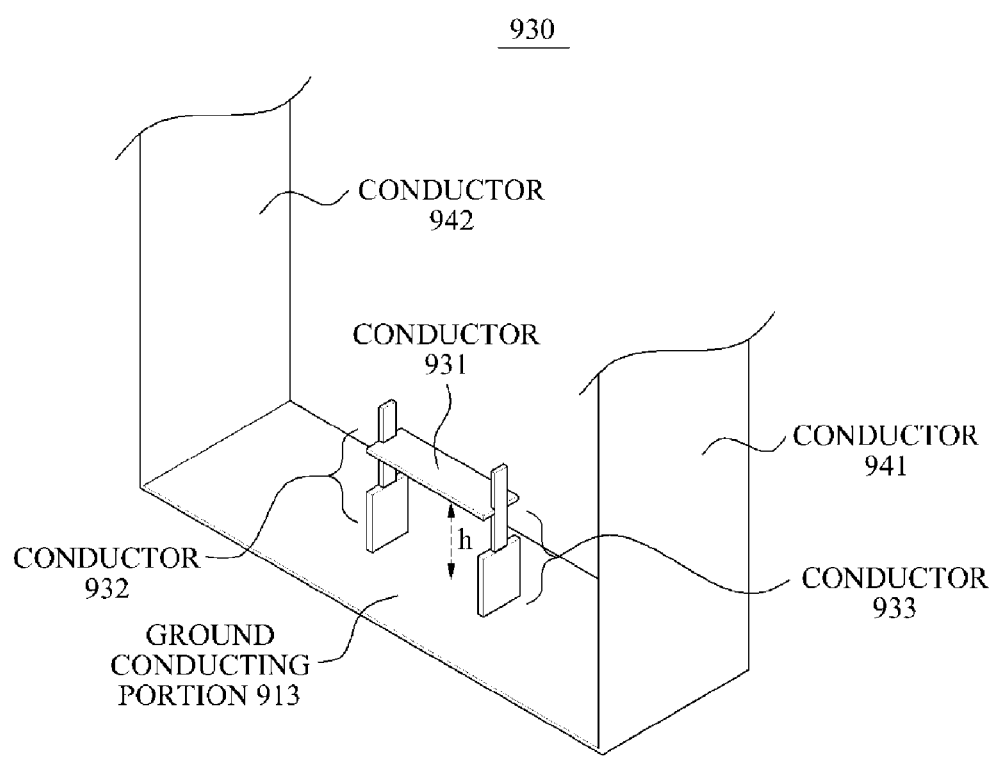

FIG. 14A illustrates one embodiment of the matcher 830 used in the resonator 800 provided in the 2D structure of FIG. 8, and FIG. 14B illustrates one embodiment of the matcher 930 used in the resonator 900 provided in the 3D structure of FIG. 9.

FIG. 14A illustrates a portion of the 2D resonator including the matcher 830, and FIG. 14B illustrates a portion of the 3D resonator of FIG. 9 including the matcher 930.

Referring to FIG. 14A, the matcher 830 may include the conductor 831, a conductor 832, and a conductor 833. The conductors 832 and 833 may be connected to the ground conducting portion 813 and the conductor 831. The impedance of the 2D resonator may be determined based on a distance h between the conductor 831 and the ground conducting portion 813. The distance h between the conductor 831 and the ground conducting portion 813 may be controlled by the controller. The distance h between the conductor 831 and the ground conducting portion 813 can be adjusted using a variety of schemes. For example, the variety of schemes may include, for instance, one or more of the following: a scheme of adjusting the distance h by adaptively activating one of the conductors 831, 832, and 833, a scheme of adjusting the physical location of the conductor 831 up and down, and/or the like.

Referring to FIG. 14B, the matcher 930 may include the conductor 931, a conductor 932, a conductor 933 and conductors 941 and 942. The conductors 932 and 933 may be connected to the ground conducting portion 913 and the conductor 931. Also, the conductors 941 and 942 may be connected to the ground conducting portion 913. The impedance of the 3D resonator may be determined based on a distance h between the conductor 931 and the ground conducting portion 913. The distance h between the conductor 931 and the ground conducting portion 913 may be controlled by the controller, for example. Similar to the matcher 830 included in the 2D structured resonator, in the matcher 930 included in the 3D structured resonator, the distance h between the conductor 931 and the ground conducting portion 913 may be adjusted using a variety of schemes. For example, the variety of schemes may include one or more of the following: a scheme of adjusting the distance h by adaptively activating one of the conductors 931, 932, and 933, a scheme of adjusting the physical location of the conductor 931 up and down, or the like.

In one or more embodiments, the matcher may include an active element. Thus, a scheme of adjusting an impedance of a resonator using the active element may be similar as described above. For example, the impedance of the resonator may be adjusted by changing a path of a current flowing through the matcher using the active element.

Figure 15:
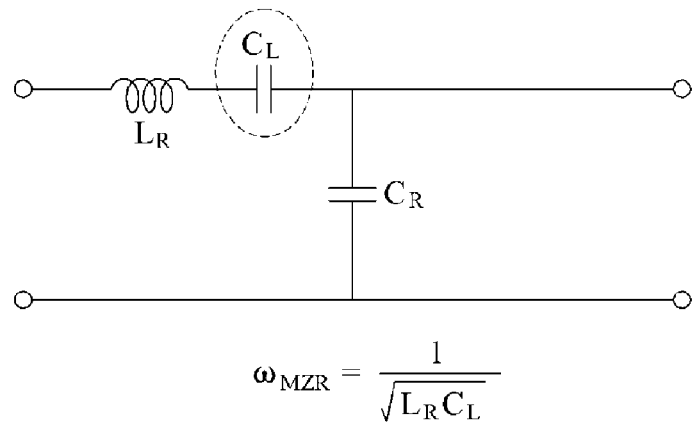
FIG. 15 is a diagram illustrating one equivalent circuit of the resonator for wireless power transmission of FIG. 8.

FIG. 15 illustrates one equivalent circuit of the resonator 800 for the wireless power transmission of FIG. 8.

The resonator 800 of FIG. 8 for the wireless power transmission may be modeled to the equivalent circuit of FIG. 15. In the equivalent circuit depicted in FIG. 15, $L_R$ denotes an inductance of the power transmission line, $C_L$ denotes a capacitor that is inserted in a form of a lumped element in the middle of the power transmission line, and $C_R$ denotes a capacitance between the power transmissions and/or ground of FIG. 8.

In some instances, the resonator 800 may have a zeroth resonance characteristic. For example, when a propagation constant is "0", the resonator 800 may be assumed to have $\omega_{MZR}$ as a resonance frequency. The resonance frequency may $\omega_{MZR}$ be expressed by Equation 1.

$$\omega_{MZR} = \frac{1}{\sqrt{L_R C_L}} \quad \text{[Equation 1]}$$

In Equation 1, MZR denotes a Mu zero resonator.

Referring to Equation 1, the resonance frequency $\omega_{MZR}$ of the resonator 800 may be determined by $L_R/C_L$. The physical size of the resonator 800 and the resonance frequency $\omega_{MZR}$ may be independent with respect to each other. Since the physical sizes are independent with respect to each other, the physical size of the resonator 800 may be sufficiently reduced.

Figure 16:
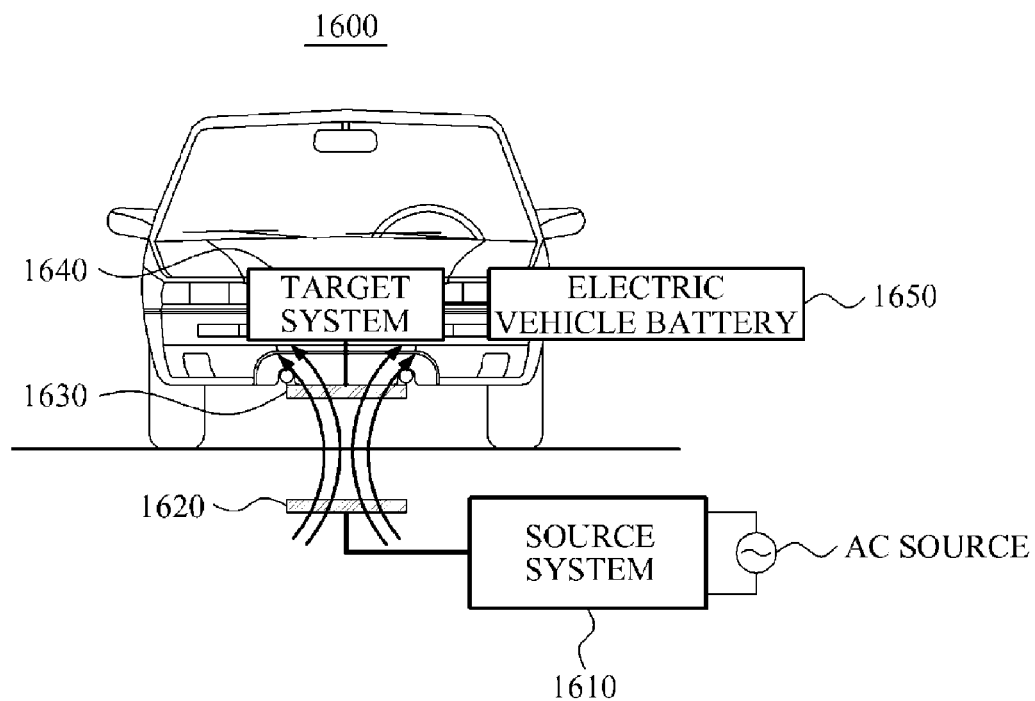
FIG. 16 is a diagram illustrating an electric vehicle charging system.

FIG. 16 illustrates an electric vehicle charging system.

Referring to FIG. 16, an electric vehicle charging system 1600 includes a source system 1610, a source resonator 1620, a target resonator 1630, a target system 1640, and an electric vehicle battery 1650.

The electric vehicle charging system 1600 may have a similar structure to the wireless power transmission system of FIG. 1. The source system 1610 and the source resonator 1620 in the electric vehicle charging system 1600 may function as a source. Additionally, the target resonator 1630 and the target system 1640 in the electric vehicle charging system 1600 may function as a target.

The source system 1610 may include a variable SMPS, a power amplifier, a matching network, a controller, and a communication unit, similarly to the source 110 of FIG. 1. The target system 1640 may include a matching network, a rectification unit, a DC/DC converter, a communication unit, and a controller, similarly to the target 120 of FIG. 1.

The electric vehicle battery 1650 may be charged by the target system 1640.

The electric vehicle charging system 1600 may use a resonant frequency in a band of a few kilohertz (KHz) to tens of MHz.

The source system 1610 may generate power, based on a type of charging vehicle, a capacity of a battery, and a charging state of a battery, and may supply the generated power to the target system 1640.

The source system 1610 may control the source resonator 1620 and the target resonator 1630 to be aligned. For example, when the source resonator 1620 and the target resonator 1630 are not aligned, the controller of the source system 1610 may transmit a message to the target system 1640, and may control alignment between the source resonator 1620 and the target resonator 1630.

For example, when the target resonator 1630 is not located in a position enabling maximum magnetic resonance, the source resonator 1620 and the target resonator 1630 may not be aligned. When a vehicle does not stop accurately, the source system 1610 may induce a position of the vehicle to be adjusted, and may control the source resonator 1620 and the target resonator 1630 to be aligned.

The source system 1610 and the target system 1640 may transmit or receive an ID of a vehicle, or may exchange various messages, through communication.

The descriptions of FIGS. 2 through 15 may be applied to the electric vehicle charging system 1600. However, the electric vehicle charging system 1600 may use a resonant frequency in a band of a few KHz to tens of MHz, and may transmit power that is equal to or higher than tens of watts to charge the electric vehicle battery 1650.

The units described herein may be implemented using hardware components, software components, or a combination thereof. For example, a processing device may be implemented using one or more general-purpose or special purpose computers, such as, for example, a processor, a controller and an arithmetic logic unit, a digital signal processor, a microcomputer, a field programmable array, a programmable logic unit, a microprocessor or any other device capable of responding to and executing instructions in a defined manner. The processing device may run an operating system (OS) and one or more software applications that run on the OS. The processing device also may access, store, manipulate, process, and create data in response to execution of the software. For purpose of simplicity, the description of a processing device is used as singular; however, one skilled in the art will appreciated that a processing device may include multiple processing elements and multiple types of processing elements. For example, a processing device may include multiple processors or a processor and a controller. In addition, different processing configurations are possible, such as parallel processors.

The software may include a computer program, a piece of code, an instruction, or some combination thereof, for independently or collectively instructing or configuring the processing device to operate as desired. Software and data may be embodied permanently or temporarily in any type of machine, component, physical or virtual equipment, computer storage medium or device, or in a propagated signal wave capable of providing instructions or data to or being interpreted by the processing device. The software also may be distributed over network coupled computer systems so that the software is stored and executed in a distributed fashion. In particular, the software and data may be stored by one or more computer readable recording mediums. The computer readable recording medium may include any data storage device that can store data which can be thereafter read by a computer system or processing device. Examples of the computer readable recording medium include read-only memory (ROM), random-access memory (RAM), CD-ROMs, magnetic tapes, floppy disks, optical data storage devices. Also, functional programs, codes, and code segments for accomplishing the example embodiments disclosed herein can be easily construed by programmers skilled in the art to which the embodiments pertain based on and using the flow diagrams and block diagrams of the figures and their corresponding descriptions as provided herein.

A number of example embodiments have been described above. Nevertheless, it should be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. An in-band data communication apparatus using a wireless power, the apparatus comprising:
    a modulating unit configured to modulate data by mixing a predetermined signal and pulse signal-type data;
    a demodulating unit configured to detect reflected power generated due to impedance mismatching between a source resonator and a target resonator, and to demodulate received data based on a variance of the reflected power, wherein the received data is modulated using a variance of the reflected power by the target resonator;
    a source resonance unit configured to transmit transmission power including the modulated data to the target resonator, and to receive the reflected power; and
    a controller to control the pulse signal-type data, and to control impedance matching between the source resonator and the target resonator,
    wherein the demodulating unit comprises:
    a low-pass filter configured to block a harmonic signal from the detected reflected power.

2. The apparatus of claim 1, wherein the demodulating unit is further configured to:
    detect the reflected power from a signal including the transmission power and the reflected power based on a coupling scheme,
    detect an envelope of the detected reflected power, and
    compare the detected envelope with a reference value, the reference value being determined based on a minimum value of a magnitude of the detected envelope.

3. The apparatus of claim 2, wherein the demodulating unit detects the reflected power from the signal, through a coupling resistor that cuts-off power corresponding to the transmission power.

4. The apparatus of claim 2, wherein the demodulating unit further comprises:
    a transmission line through which the signal flows; and
    a coupling line used for detecting the reflected power through coupling with the transmission line,
    wherein the reflected power is detected based on the distance between the transmission line and the coupling line, and/or the length of the coupling line.

5. The apparatus of claim 2, wherein the controller provides a reference signal to determine whether a variance of the reflected power is high or low.

6. An in-band data communication apparatus using a wireless power, the apparatus comprising:

a target resonance unit configured to transmit reflected power to a source resonator, and to receive reception power including data;

a modulating unit configured to control a variance of the reflected power by adjusting an impedance of a target device, so as to modulate data;

a demodulating unit configured to detect an envelope of the reception power, and to demodulate the received data included in the reception power by comparing the detected envelope and a predetermined reference value; and a controller configured to provide an adjustment signal for the impedance of the target device and the predetermined reference value, and to perform impedance matching between a target resonator and a load, wherein the demodulating unit comprises:

a low-pass filter configured to block a harmonic signal from the reception power.

7. The apparatus of claim 6, wherein the modulating unit adjusts the impedance by controlling current flowing through the load.

8. The apparatus of claim 6, wherein the modulating unit controls the variance of the reflected power by adjusting the impedance through a current source operating as a variable load, so as to modulate the data.

9. The apparatus of claim 6, wherein the modulating unit controls the variance of the reflected power by adjusting the impedance through a switch connected to the load so as to modulate the data.

10. The apparatus of claim 6, wherein the demodulating unit further comprises:

an envelope detecting unit configured to detect an envelope of the reception power; and a comparing unit configured to demodulate the received data, by comparing the detected envelope and a reference value, the reference value being determined based on a minimum value of a magnitude of the detected envelope.

11. The apparatus of claim 6, further comprising:

an alternating current/direct current (AC/DC) converting unit configured to convert the reception power to a DC signal.

12. An in-band data communication method using a wireless power, the method comprising:

modulating a pulse signal-type data by mixing a predetermined signal and the pulse signal-type data;

transmitting a transmission power including the modulated data to a target resonator, and receiving reflected power;

detecting the reflected power generated due to impedance mismatching between a source resonator and the target resonator, and demodulating received data based on a variance of the reflected power, wherein the received data is modulated using a variance of the reflected power by the target resonator; and providing the pulse signal-type data, and controlling impedance matching between the source resonator and the target resonator, wherein the demodulating comprises:

blocking a harmonic signal from the detected reflected power by a low-pass filter.

13. The method of claim 12, wherein the demodulating further comprises:

detecting the reflected power from a signal including the transmission power and the reflected power, based on a coupling scheme;

detecting an envelope of the detected reflected power; and comparing the detected envelope and a reference value, the reference value being determined based on a minimum value of a magnitude of the detected envelope.

14. The method of claim 13, wherein the detecting comprises:

detecting the reflected power from the signal, through a coupling resistor that blocks power corresponding to the transmission power.

15. The method of claim 13, wherein the detecting comprises:

utilizing a transmission line through which the signal flows and a coupling line for detecting the reflected power through coupling with the transmission line, wherein the reflected power is detected based on the distance between the transmission line and the coupling line, and/or the length of the coupling line.

16. An in-band data communication method using a wireless power, the method comprising:

modulating data by controlling a variance of reflected power through adjusting an impedance of a target device;

transmitting the reflected power to a source resonator, and receiving a reception power including data;

detecting an envelope of the reception power, and demodulating the received data included in the reception power by comparing the detected envelope and a predetermined reference value; and providing an adjustment signal of the impedance of the target device and the predetermined reference value, and controlling impedance matching between a target resonator and a load, wherein the demodulating comprises:

blocking a harmonic signal from the reception power by a low-pass filter.

17. The method of claim 16, wherein the modulating comprises:

adjusting the impedance by controlling current flowing through the load.

18. The method of claim 16, wherein the modulating comprises:

controlling the variance of the reflected power by adjusting the impedance through a current source operating as a variable load.

19. The method of claim 16, wherein the modulating comprises:

controlling the variance of the reflected power by adjusting the impedance through a switch connected to the load.

* * * * *